(12) United States Patent
Harada et al.

(10) Patent No.: US 9,502,130 B2
(45) Date of Patent: Nov. 22, 2016

(54) SEMICONDUCTOR MEMORY DEVICE

(71) Applicant: KABUSHIKI KAISHA TOSHIBA, Minato-ku (JP)

(72) Inventors: Yoshikazu Harada, Kawasaki (JP); Masahiro Yoshihara, Yokohama (JP); Naofumi Abiko, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/846,072

(22) Filed: Sep. 4, 2015

(65) Prior Publication Data

US 2016/0260497 A1    Sep. 8, 2016

Related U.S. Application Data

(60) Provisional application No. 62/129,517, filed on Mar. 6, 2015.

(51) Int. Cl.
| | |
|---|---|
| *G11C 16/34* | (2006.01) |
| *G11C 11/56* | (2006.01) |
| *G11C 16/32* | (2006.01) |
| *G11C 16/10* | (2006.01) |
| *G11C 16/26* | (2006.01) |
| G11C 16/04 | (2006.01) |

(52) U.S. Cl.
CPC ....... *G11C 16/3459* (2013.01); *G11C 11/5671* (2013.01); *G11C 16/10* (2013.01); *G11C 16/26* (2013.01); *G11C 16/32* (2013.01); *G11C 16/0483* (2013.01); *G11C 16/3445* (2013.01); *G11C 2211/5621* (2013.01)

(58) Field of Classification Search
CPC ............. G11C 16/0483; G11C 16/3445; G11C 2211/5621
USPC .......................... 365/185.17, 185.22, 185.03
See application file for complete search history.

(56) References Cited

U.S. PATENT DOCUMENTS

| | | | | |
|---|---|---|---|---|
| 8,174,899 | B2* | 5/2012 | Ueno | G11C 16/32 365/185.19 |
| 8,203,877 | B2* | 6/2012 | Fujiu | G11C 16/0483 365/185.02 |
| 2006/0291291 | A1* | 12/2006 | Hosono | G11C 16/12 365/185.22 |
| 2012/0294093 | A1* | 11/2012 | Yang | G11C 11/5642 365/185.22 |
| 2012/0320675 | A1* | 12/2012 | Kang | G11C 11/5628 365/185.03 |

\* cited by examiner

*Primary Examiner* — Ly D Pham
(74) *Attorney, Agent, or Firm* — Oblon, McClelland, Maier & Neustadt, L.L.P.

(57) ABSTRACT

According to one embodiment, a device includes a memory cell array including memory cells and controller. The controller executes verification of second data in a first verify period in a first verify operation and verification of third data in a second verify period in the first verify operation. The controller excludes memory cells to be written first data from a target of the first verify operation at a first time in the first verify period and excludes memory cells to be written the second data from the target at a second time in the second verify period.

11 Claims, 23 Drawing Sheets

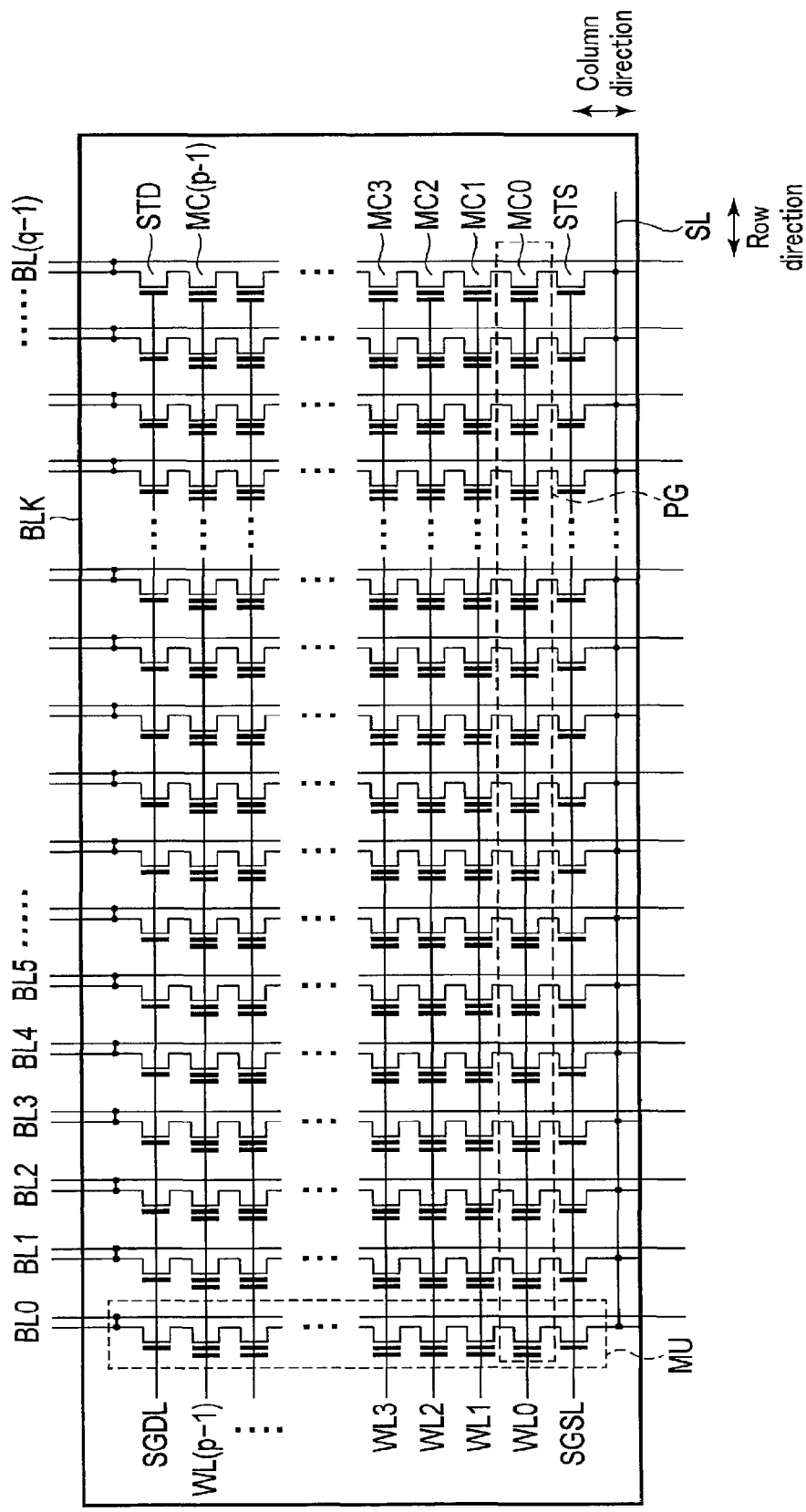
F I G. 2

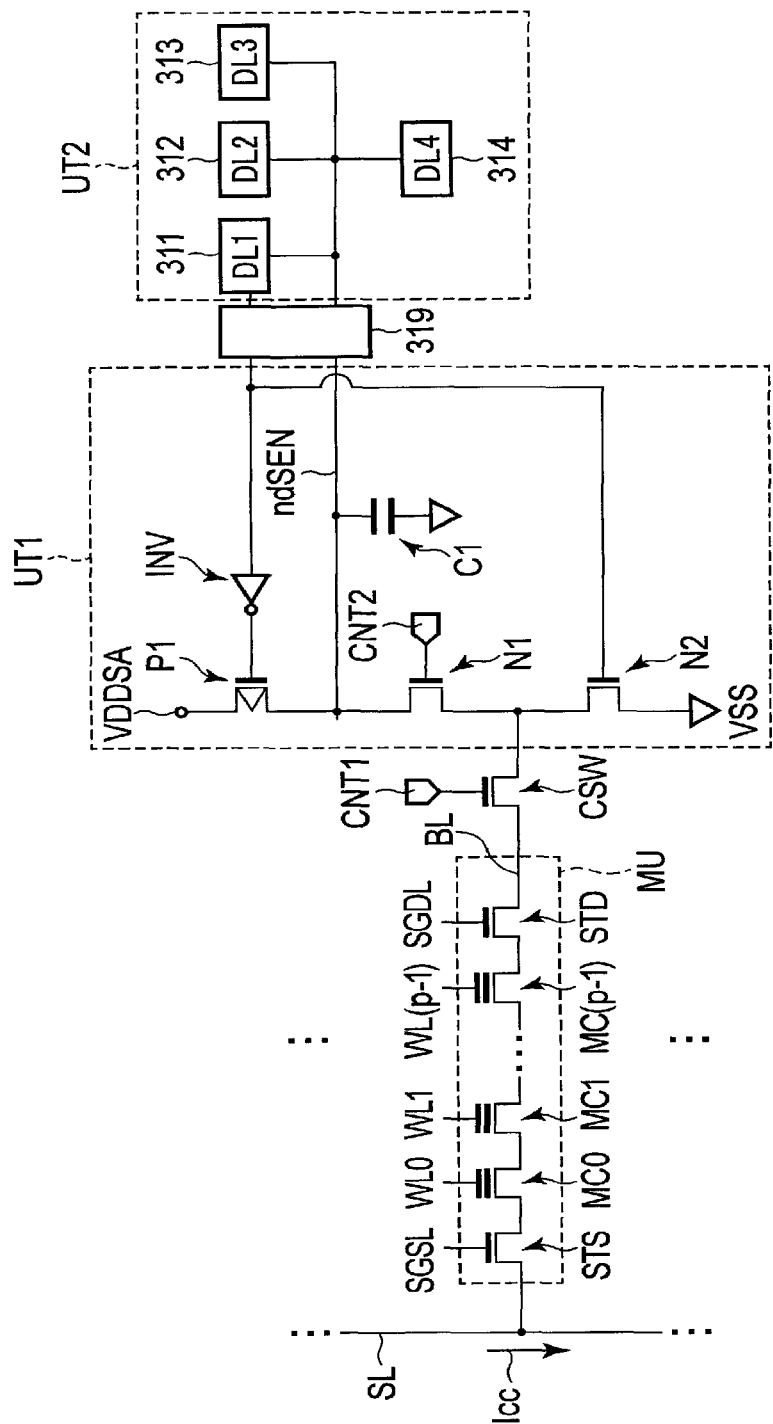
F I G. 3

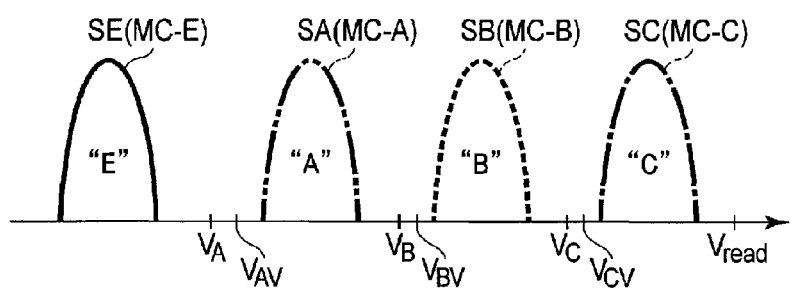
F I G. 4
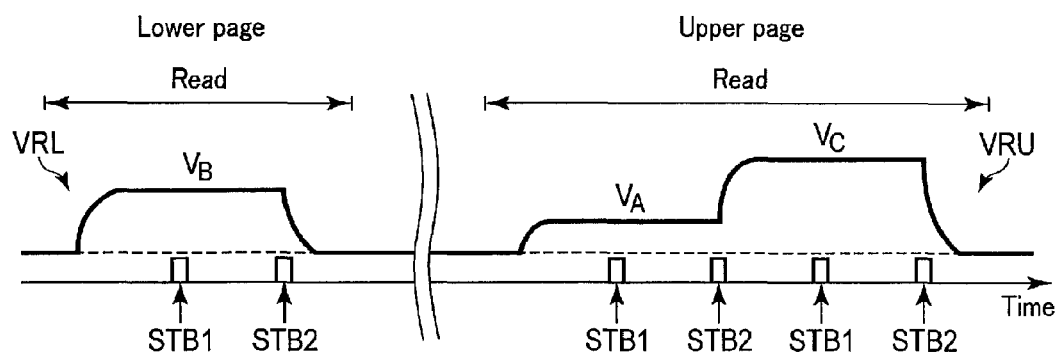
F I G. 5

|  | State | | | |
|---|---|---|---|---|
|  | E | A | B | C |
| DL1 (Lower) | 1 | 1 | 0 | 0 |
| DL2 (Upper) | 1 | 0 | 0 | 1 |
| Verify result A state ($V_{AV}$) | 1 | 0/1 | 1 | 1 |
| Verify result B state ($V_{BV}$) | (0) | (0) | 0/1 | 0/1 |
| Verify result C state ($V_{CV}$) | (0) | (0) | (0) | 0/1 |

F I G. 8

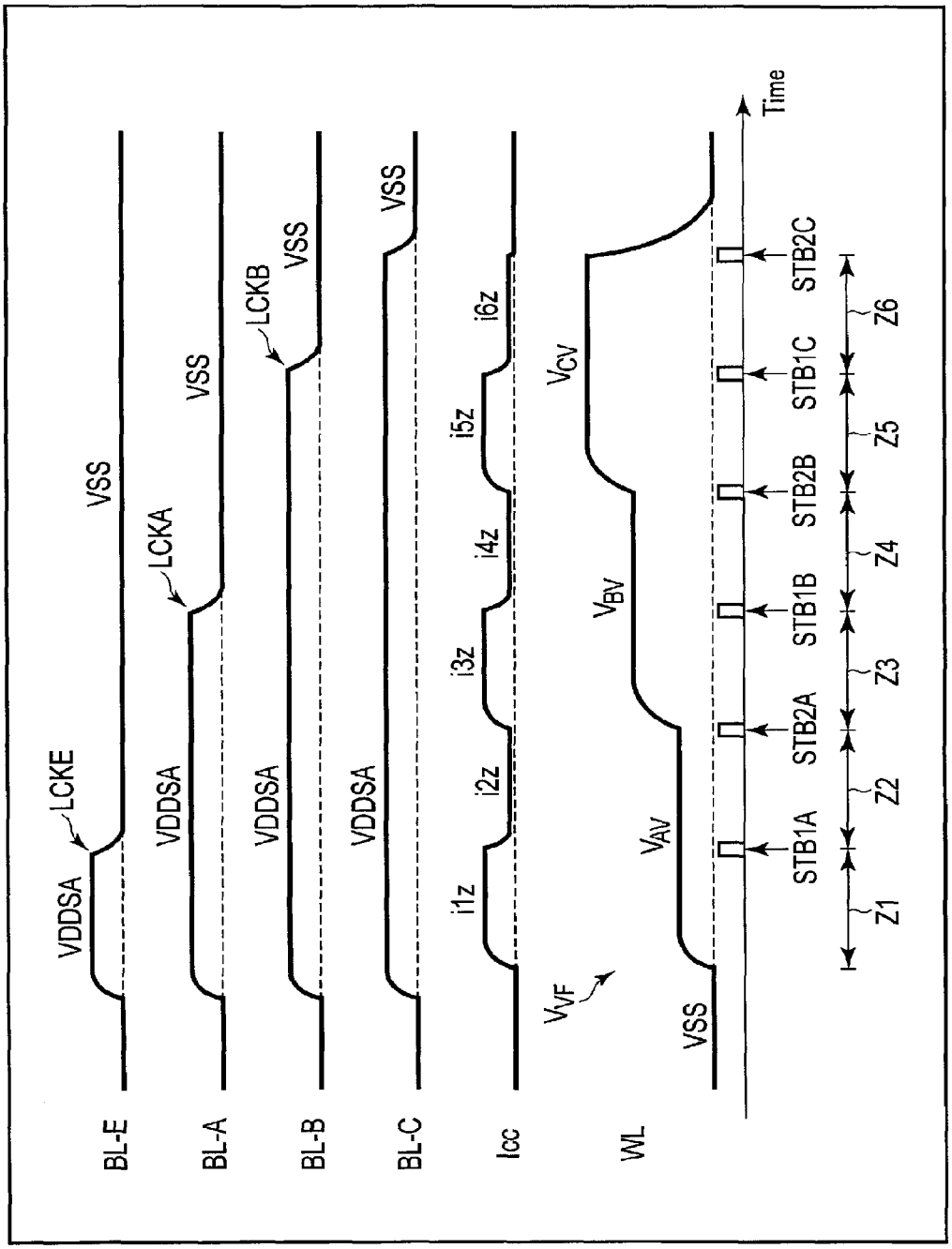
F I G. 11

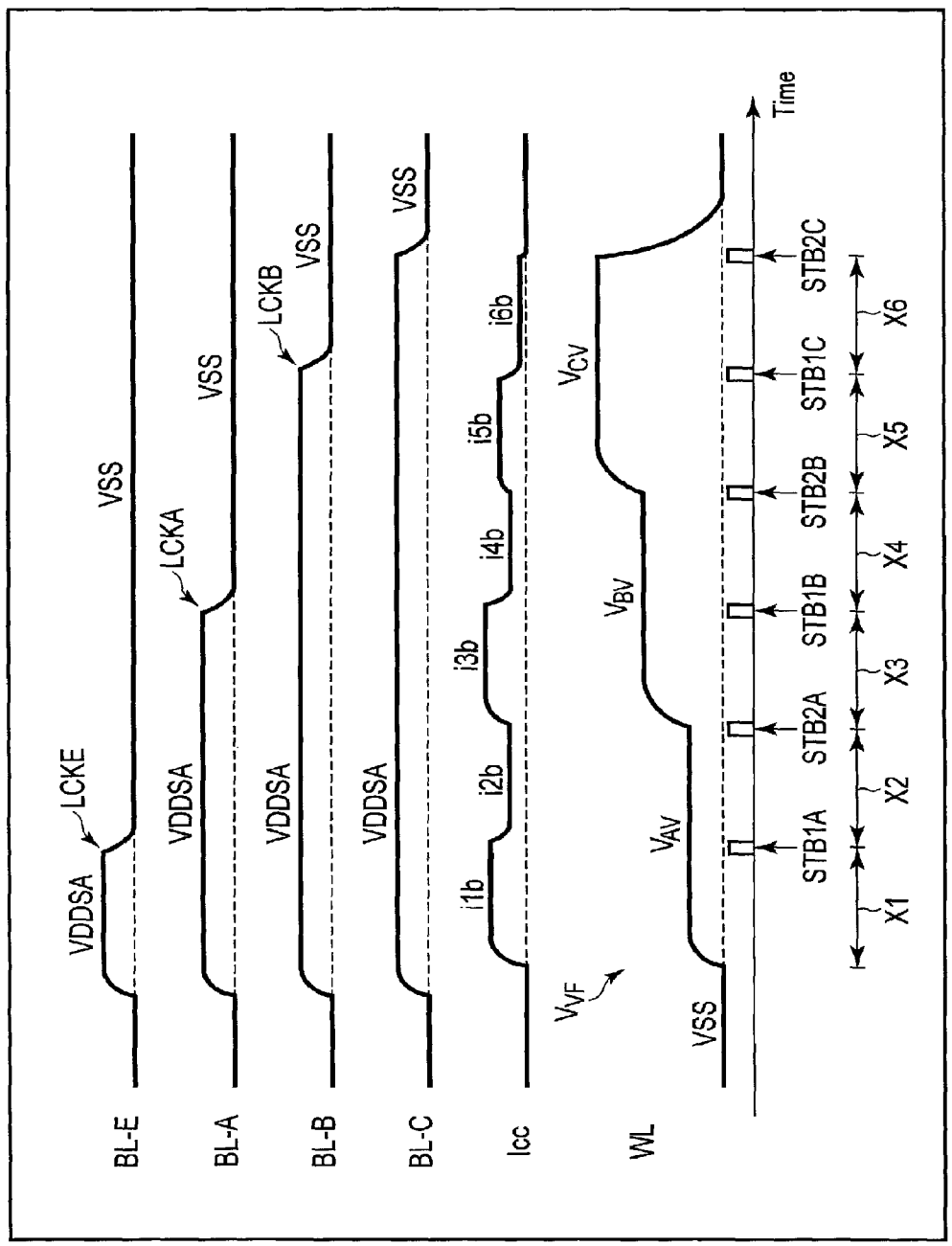
F I G. 13

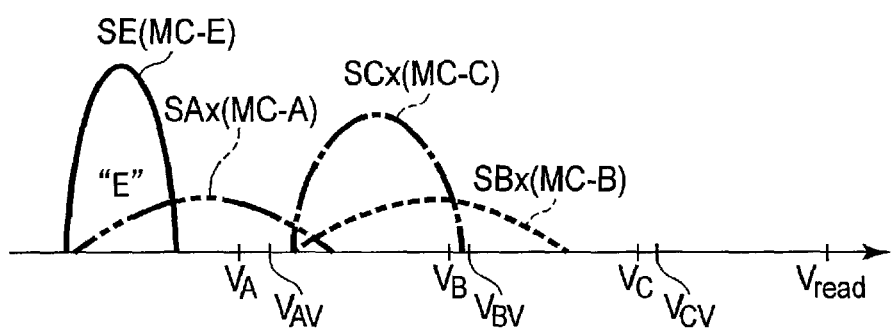
F I G. 16

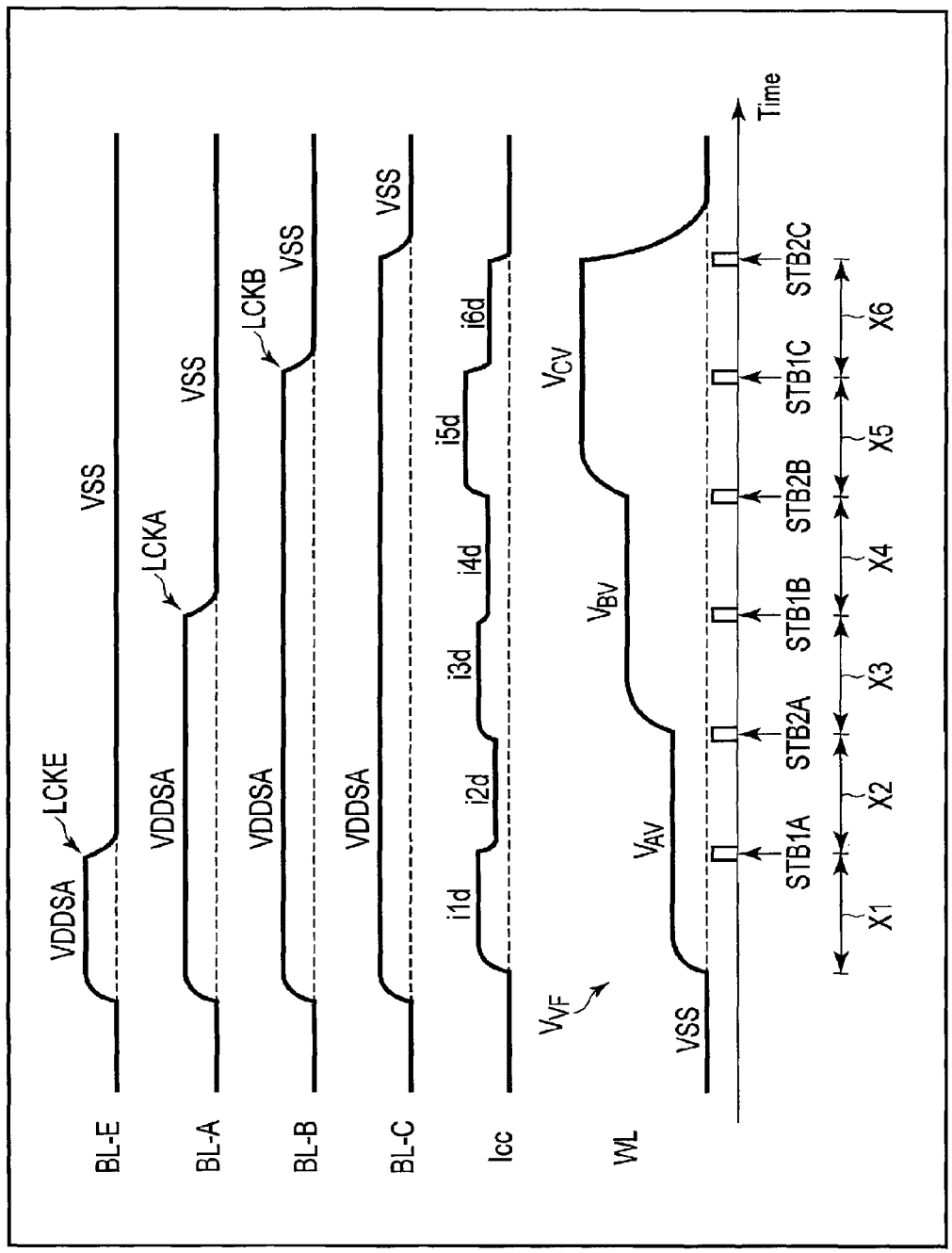
F I G. 17

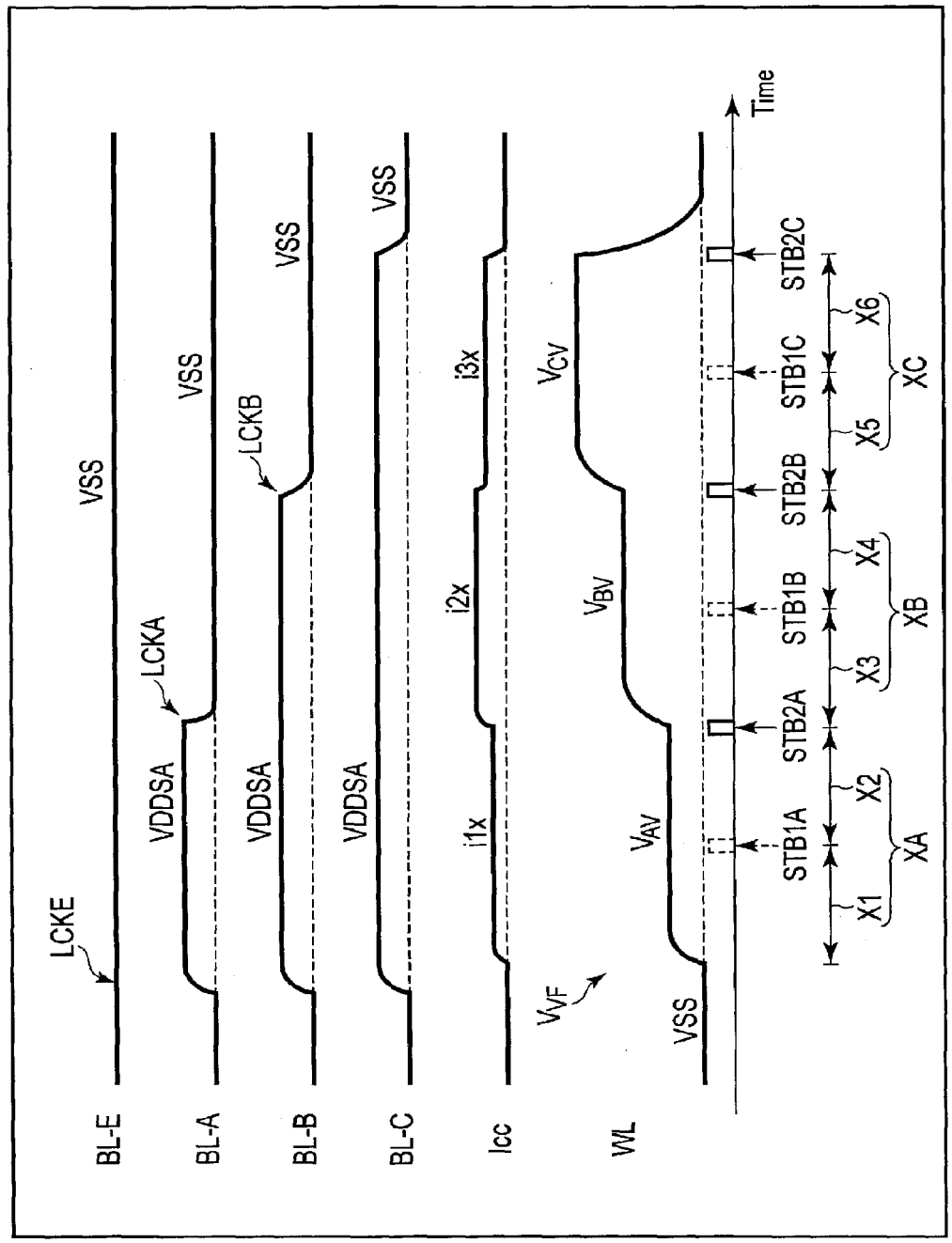
F I G. 19

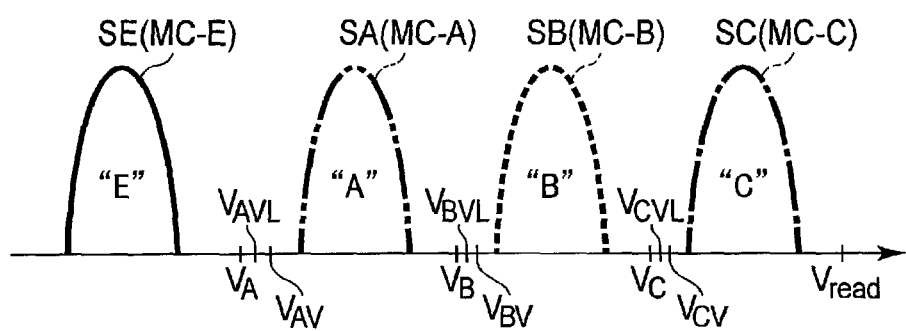
F I G. 22

SEMICONDUCTOR MEMORY DEVICE

CROSS-REFERENCE TO RELATED APPLICATIONS

This application claims the benefit of U.S. Provisional Application No. 62/129,517, filed Mar. 6, 2015, the entire contents of which are incorporated herein by reference.

FIELD

Embodiments described herein relate generally to a semiconductor memory device.

BACKGROUND

Semiconductor memory is mounted on various electronic devices.

For example, the flash memory is in widespread use as a main storage device along with HDD, CD, and DVD.

Various technologies have been proposed to improve operating characteristics of the flash memory.

BRIEF DESCRIPTION OF THE DRAWINGS

FIG. 2 is an equivalent circuit diagram showing a configuration example of a memory cell array;

FIG. 3 is an equivalent circuit diagram showing a configuration example of a sense amplifier circuit and a data latch circuit;

FIG. 4 is a schematic diagram showing a relationship between data stored in a memory cell and a threshold of the memory cell;

FIG. 5 is a schematic diagram illustrating reading of data from the semiconductor memory according to an embodiment;

FIG. 8 is a schematic diagram illustrating writing of data into the semiconductor memory according to a first embodiment;

FIG. 11 is a timing chart illustrating the verify operation when data is written into the semiconductor memory according to the first embodiment;

FIG. 13 is a timing chart illustrating the verify operation when data is written into the semiconductor memory according to the second embodiment;

FIG. 16 is a schematic diagram illustrating writing of data into the semiconductor memory according to a fourth embodiment;

FIG. 17 is a timing chart illustrating the verify operation when data is written into the semiconductor memory according to the fourth embodiment;

FIG. 19 is a schematic diagram illustrating a modification of the semiconductor memory according to an embodiment;

FIG. 22 is a schematic diagram illustrating a modification of the semiconductor memory according to an embodiment;

DETAILED DESCRIPTION

Figure 1:
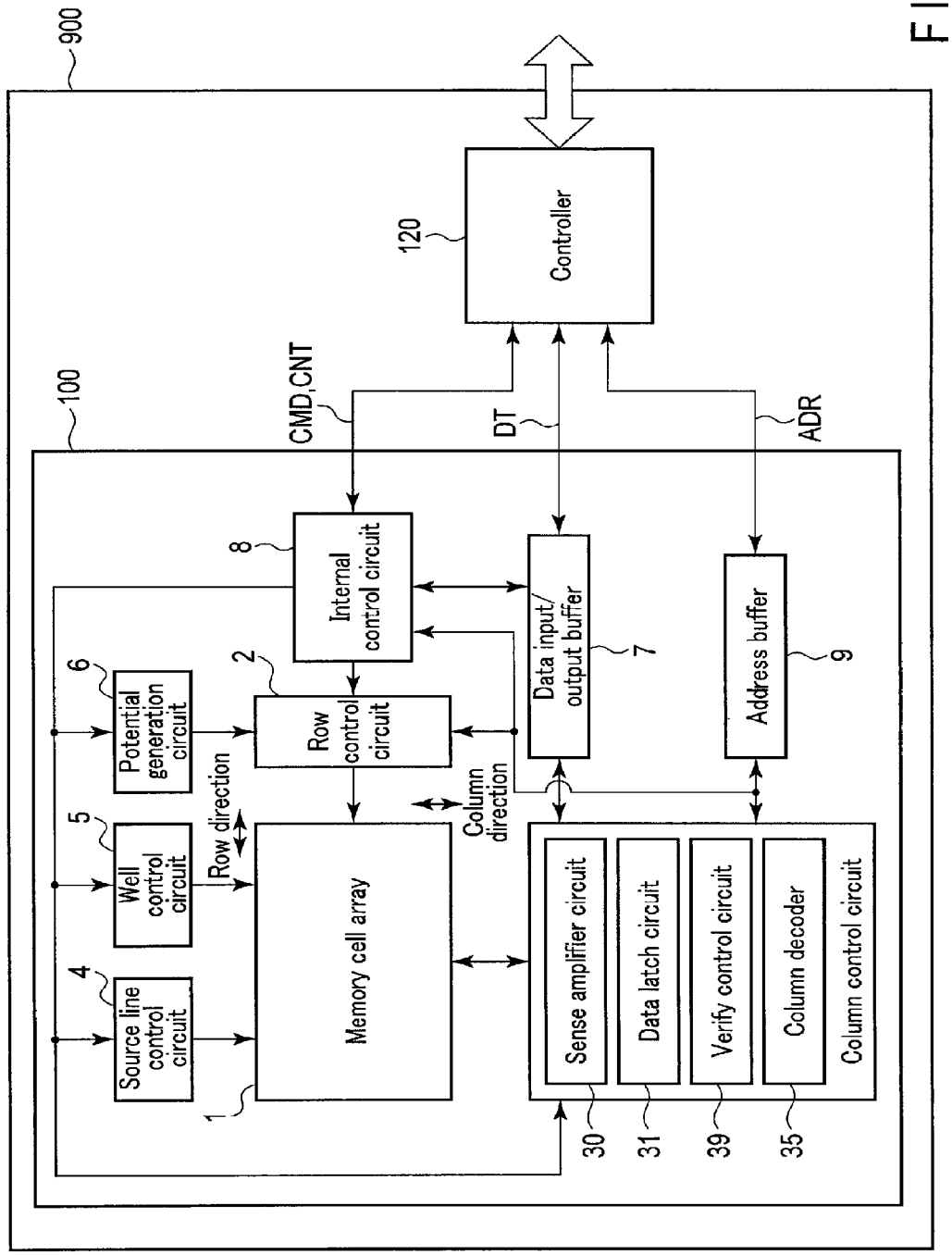
FIG. 1 is a block diagram showing a configuration example of a semiconductor memory according to an embodiment.

Hereinafter, the embodiments will be described in detail with reference to the drawings. In the description that follows, the same reference numerals are attached to elements having the same function and configuration and a duplicate description will be provided when necessary.

In general, according to one embodiment, a semiconductor memory includes a memory cell array including memory cells, a memory cell capable of storing any one among first data, second data, and third data; and a controller configured to control a first verify operation in writing of data to the memory cell array. The controller executes verification of the second data in a first verify period in the first verify operation and verification of the third data in a second verify period in the first verify operation. The controller excludes memory cells to be written the first data among the memory cells from a target of the first verify operation at a first time instant in the first verify period and excludes memory cells to be written the second data from the target at a second time instant in the second verify period.

EMBODIMENTS

Semiconductor memories according to the embodiments will be described with reference to FIGS. 1 to 23.

In the description that follows, the same reference numerals are attached to elements having the same function and configuration in each of the following embodiments and a duplicate description is omitted.

(A) First Embodiment

FIGS. 1 to 15 are referred to for the description of a semiconductor memory according to the first embodiment.

(1) Configuration

FIG. 1 is a schematic diagram illustrating a configuration example of a semiconductor memory according to an embodiment.

As shown in FIG. 1, a semiconductor memory 100 according to an embodiment is provided inside a storage device 900. A controller 120 is provided inside the storage device 900. The semiconductor memory 100 is driven based on instructions from the controller 120. The storage device 900 is coupled to a host device (not shown) (for example, MPU).

As shown in FIG. 1, the semiconductor memory 100 includes a memory cell array 1. If the semiconductor memory 100 is a NAND-type flash memory, the memory cell array 1 includes a plurality of blocks.

FIG. 2 is an equivalent circuit diagram showing a configuration example of a block of the memory cell array 1.

In the NAND-type flash memory, for example, each block BLK includes a plurality of memory units (NAND strings) MU. The plurality of memory units MU are arranged in a row direction.

Each memory unit MU includes a plurality of memory cells MC and two select gate transistors ST1, ST2.

In each memory cell unit MU, a current path of a plurality of memory cells MC0, MC1, . . . , MC(p-1) is connected in series. In the description that follows, when the memory cells MC0, MC1, . . . , MC(p-1) are not distinguished, each memory cell is denoted as a memory cell MC.

The memory cell MC is, for example, a transistor including a charge storage layer. The charge storage layer includes at least one of a floating electrode and a charge trap layer (for example, an SiN layer).

The current path of a select gate transistor STD is connected in series to one end (drain side) of the memory cell MC connected in series.

The current path of a select gate transistor STS is connected in series to the other end (source side) of the memory cell MC connected in series.

A plurality of word lines WL0, WL1, . . . , WL(p-1) are provided in the block BLK. Each of the word lines WL0 to WL(p-1) is commonly connected to gates of the plurality of memory cells MC arranged in the row direction. One page or more is allocated to the plurality of memory cells MC connected to the common word line. Writing and reading of data in a NAND-type flash memory is performed in units of pages.

A plurality of bit lines BL0, BL1, . . . , BL(q-1) are provided in the block BLK. A corresponding bit line of the bit lines BL0 to BL(q-1) is connected one end (drain) of the current path of the select gate transistor STD.

A source line SL is provided in the block BLK. The source line SL is connected to one end (source) of the current path of the select gate transistor STS.

Drain-side and source-side select gate lines SGDL, SGSL are provided in the block BLK. The drain-side select gate line SGDL is connected to gates of the select gate transistors STD arranged in the row direction. The source-side select gate line SGSL is connected to gates of the select gate transistors STS arranged in the row direction.

In the description that follows, when the word lines WL0, WL1, . . . , WL(p-1) are not distinguished, each word line is denoted as a word line WL. When the bit lines BL0, BL1, . . . , BL(p-1) are not distinguished, each bit line is denoted as a bit line BL.

As shown in FIG. 1, the flash memory 100 includes a plurality of circuits (peripheral circuits) to control the operation of the memory cell array 1.

A row control circuit 2 can control the rows of the memory cell array 1. The row control circuit 2 is connected to the word line WL and the select gate lines SGDL, SGSL provided in the memory cell array 1. The row control circuit 2 can select the block BLK and a page PG based on an address signal transferred from an address buffer 9 and can control the operation (potential) of the word line WL and the select gate lines SGDL, SGSL. For example, the row control circuit 2 includes a row decoder and a driver.

A source line control circuit 4 can control the potential of the source line SL. A well control circuit 5 can control the potential of each well region in the memory cell array 1 and the block BLK.

A voltage generation circuit 6 generates a write voltage, a read voltage, and a non-selection voltage (passing voltage) applied to each word line WL when data is written (programmed), read, and erased respectively. The voltage generation circuit 6 generates voltages applied to, for example, the select gate lines SGDL, SGSL. Various voltages generated by the voltage generation circuit 6 are input into the row control circuit 2 and are applied to the word line WL and the select gate lines SGDL, SGSL. The voltage generation circuit 6 generates voltages applied to the source line SL and voltages applied to the well region. The voltage generation circuit 6 transfers generated voltages to the source line control circuit 4 and the well control circuit 5.

A data input/output buffer 7 is an interface for data input/output. The data input/output buffer 7 temporarily holds data DT from the controller 120 and outputs the data DT to the memory cell array 1 at a predetermined timing via a column control circuit 3. The data input/output buffer 7 temporarily holds data DT output from the memory cell array 1 and outputs the data DT to the controller 120 at a predetermined timing.

An address buffer 9 temporarily holds an address signal ADR from the controller 120. The address signal ADR from the controller 120 indicates a physical address and contains a physical row address and a physical column address.

An internal control circuit (also called a state machine or a sequencer) 8 manages an overall operation of the flash memory 100. The internal control circuit 8 receives a command CMD and a control signal CNT from the controller 120. The internal control circuit 8 sends a control signal (status) showing an operating state inside the flash memory 100 to the controller 120. Accordingly, the controller 120 is notified of the operating state of the flash memory 100.

The column control circuit 3 controls the columns of the memory cell array 1. The column control circuit 3 includes a sense amplifier circuit 30, a data latch circuit 31, a column decoder 35, and a verify control circuit 39.

The sense amplifier circuit 30 is connected to the bit line BL provided in the memory cell array 1. The sense amplifier circuit 30 detects current generation or potential fluctuations in the bit line BL when data is read (when data is output from the memory cell array 1) and amplifies a signal based on the detected current/potential. Accordingly, data stored in the memory cell MC is discriminated. The sense amplifier circuit 30 can control the potential of the bit line BL in accordance with data to be written into the memory cell MC when data is written (when data is input into the memory cell array 1).

The data latch circuit 31 temporarily stores data read from the memory cell array 1 and data to be written into the memory cell array 1.

The column decoder 35 selects and activates the control unit set to the column of the memory cell array 1.

The verify control circuit 39 controls the verify operation when data is written into the flash memory 100.

FIG. 3 is a schematic diagram illustrating a connection relation between the bit line BL in the memory cell array 1, the sense amplifier circuit 30 and the data latch circuit 31.

The sense amplifier circuit 30 includes a plurality of sense units UT1. Each sense unit UT1 is connected to one or more bit lines BL via a column selection switch (bit line selection switch) CSW.

A control signal CNT1 is supplied to the gate of the column selection switch CSW. The connection between the bit line BL and the sense unit UT1 is controlled by On/Off of the column selection switch CSW.

The sense unit UT1 can sense the current flowing to the bit line BL or the potential (voltage) of the bit line BL. The sense unit UT1 can control the charge and discharge of the bit line BL.

For example, when reading of data in a flash memory (determination of a threshold of the memory cell) is performed by using the ABL (all bit line) method, reading of data is performed by all bit lines in the memory cell array (block) being driven simultaneously. In a flash memory of the ABL method, one sense unit UT1 is connected to one bit line BL.

The sense unit UT1 includes a plurality of transistors P1, N1, N2. One end of the current path of the P-type transistor P1 is connected to a voltage terminal VDDSA. A voltage VDDSA is, for example, about 0.8 V to 1.5 V. A drive voltage VDDSA is applied to the voltage terminal VDDSA. The other end of the current path of the P-type transistor P1 is connected to one end of the current path of the N-type transistor N1. The other end of the current path of the N-type transistor N1 is connected to one end of the current path of the N-type transistor N2. The other end of the current path of the N-type transistor N2 is connected to a voltage terminal VSS. A ground voltage VSS (or the reference voltage) is applied to the voltage terminal VSS.

A sense node (interconnect) ndSEN is connected to a connection node of the P-type transistor P1 and the N-type transistor N1. One end of a capacitative element C1 is connected to the sense node ndSEN. The sense node ndSEN can be charged to a potential in accordance with the capacity of the capacitative element C1.

The gate of the P-type transistor P1 is connected to a processing unit 319 via an inverter INV. The gate of the N-type transistor N1 is connected to the processing unit 319. On/Off of the P-type transistor P1 and the N-type transistor N1 is controlled by a signal from the processing unit 319.

A control signal CNT2 is supplied to the gate of the N-type transistor N1. On/Off of the N-type transistor N1 is controlled by the control signal CNT2.

The charge/discharge of the bit line BL and the sense node ndSEN is controlled by controlling On/Off of the transistors CSW, P1, N1, N2.

Reading of data is performed by the generation of a current (or fluctuations of the potential of the sense node ndSEN) in the sense node ndSEN conducting to the bit line BL being detected.

The data latch circuit 31 includes a plurality of latch units UT2. One latch unit UT2 corresponds to one sense unit UT1.

The latch unit UT2 temporarily stores data (write data) from the controller 120, data (read data) from the memory cell MC, and results of the verify operation for each bit line BL (NAND string MU).

The latch unit UT2 can hold a control signal of the sense unit UT1 in at least one of a plurality of latches to control potential states of the bit line BL and the sense node ndSEN. The latch unit UT2 can hold various kinds of information (flags) to write data.

The latch unit UT2 includes a plurality of latches (flip-flops) 311, 312, 313, 314. Each of the latches 311, 312, 313, 314 holds a 1-bit signal. The signal (data) in each of the latches 311, 312, 313, 314 is updated in accordance with the operating state of the flash memory 100.

The processing unit 319 is provided between the sense unit UT1 and the latch unit UT2. The processing unit 319 controls transmission and reception (data transfer) of a signal between the sense unit UT1 and the latch unit UT2. The processing unit 319 can control the operation of the latch unit UT2 based on sense results of the bit line BL by the sense unit UT1. The processing unit 319 can control the operation of the sense unit UT1 and the charge/discharge of the sense node ndSEN based on data stored in the latch unit UT2. For example, the processing unit 319 has a function to calculate each piece of data in the latch unit UT to generate a control signal of the sense unit UT1.

In the sense unit UT1 and the latch unit UT2, fluctuation in the potential (or generation of the current) in the sense node ndSEN is associated with signals (write/read data) transmitted and received between the sense unit UT1 and the latch unit UT2.

The functions of the sense amplifier circuit 30 and the data latch circuit 31 may be realized by, instead of mutually independent circuits, one circuit having functions of both of the sense amplifier and the latch.

A basic operation of the flash memory according to the present embodiment will be described using FIGS. 4 to 9.

FIG. 4 is a schematic diagram illustrating the correspondence between data stored in the memory cell and a threshold state of the memory cell.

The memory cell MC can store 1-bit data or more by the threshold (threshold value) of the memory cell MC and data to be stored being associated.

As shown in FIG. 4, the memory cell MC of the flash memory according to the present embodiment stores, for example, 2-bit data.

The 2-bit data is represented by "11", "01", "10", and "00". The memory cell MC capable of storing 2-bit data has one of four threshold states (threshold voltage) in accordance with data to be stored. Hereinafter, threshold states SE, SA, SB, SC of the memory cell corresponding to 2-bit data will be called an E state (erased state) SE, an A state SA, a B state SB, and a C state SC in ascending order of threshold voltage.

When the memory cell MC stores 2-bit data, two pages (row addresses) are allocated to one word line.

Hereinafter, the lower-order 1 bit of 2-bit data will be called lower data and the upper-order 1 bit will be called upper data. The page to which lower data is allocated will be called a lower page and the page to which upper data is allocated will be called an upper page.

In the present embodiment, shifting the threshold of the memory cell MC to write data corresponding to a certain state will also be described as the memory cell MC being written into a certain state.

FIG. 5 is a schematic diagram illustrating reading of data from the flash memory.

As shown in FIG. 5, reading of data in the flash memory 1 is performed by read voltages (read selection voltage) VRL, VRU being applied to the word line (selected word line) to which the memory cell (selected cell) MC to be read target is connected. Data stored in the memory cell MC is discriminated by whether the memory cell MC is turned on detected when the read voltage is applied to the word line (gate of the memory cell).

As shown in FIG. 4, discrimination voltage values (hereinafter, called reading levels) $V_A$, $V_B$, $V_C$ are set to between states.

When data is read from a memory cell storing 2 bits, 1 bit (two values) is read from each of lower-order data and higher-order data.

Thus, as shown in FIG. 5, when reading data, the read voltage VRL including the B state reading level $V_B$ is applied to the word line WL to read lower-order data (to discriminate the memory cell of the B state). To read the upper page (to discriminate the memory cell of the A/C states), the read voltage VRU including the A state reading level $V_A$ ($<V_B$) and the C state reading level $V_C$ ($>V_B$) is applied to the word line WL.

A non-selection voltage (read passing voltage) $V_{READ}$ is set to a voltage value larger than the discrimination voltage value of the highest state so that non-selected memory cells are turned on when data is read. When data is read, non-selected memory cells are turned on and also two select gate transistors STS, STD of each memory cell unit are turned on, one end of the memory unit MU conducts to the bit line BL, and the other end of the memory unit MU conducts to the source line SL.

When data is read, the initial state of the bit line BL is set to a state in which the voltage VDDSA is applied thereto (charged state).

To read data, a certain reading level is applied to the selected word line WL as the read voltage. Memory cells whose threshold is larger than the certain reading level are turned off and memory cells whose threshold is equal to the certain reading level or less are turned on.

The bit line BL is electrically separated from the source line SL by the memory cell MC in an off state. Accordingly, the bit line BL connected to the memory cell MC in an off state maintains the charged state without generation of a current between the bit line BL and the source line SL.

The bit line BL conducts to the source line SL by the memory cell MC in an On state. Accordingly, the bit line BL connected to the memory cell MC in an On state is discharged and thus, the potential of the bit line BL fluctuates. Accompanying the fluctuation, the potential of the sense node ndSEN connected to the bit line BL also fluctuates. At this point, a current flows between the source line SL and the bit line BL.

The generation of a current in the sense node ndSEN in accordance with On/Off of the memory cell MC by the reading level is detected. When the state of the sense node ndSEN is a charged state, the memory cell corresponding to the sense node stores data of the state corresponding to the reading level (and upper states of the state). When the state of the sense node ndSEN is a discharged state, the memory cell corresponding to the sense node stores data of states lower than the state corresponding to the reading level.

Thus, data stored in the memory cell MC is read by state changes of the bit line BL/sense node ndSEN corresponding to On/Off of the memory cell MC.

For example, as shown in FIG. 5, two threshold determinations STB1, STB2 may be made for each reading level in the read operation of the flash memory.

The reason for performing the read operation (determination of the threshold of the memory cell) twice for one reading level is to prevent erroneous reading due to the rise of potential of the source line SL. Due to the rise of potential of the source line SL, correct reading (threshold determination) may be impracticable. If read data is determined by the first reading only, even if a memory cell holds data corresponding to a low threshold, the memory cell may erroneously be determined to have data of a high threshold for a bit line having higher resistance to current. By excluding bit lines determined to have data corresponding to a low threshold after the first reading from the threshold determination, the amount of a current Icc generated in the memory cell array when data is read can be reduced and the potential of the source line can be inhibited from rising. By performing reading again (second reading) in this state, data can be read with high precision also from a bit line having higher resistance to current.

In the description that follows, this reading method is called a twice reading method (or a 2-strobe method). The processing in which memory cells are excluded from the threshold determination after the first reading is called lockout processing. The lockout processing is performed by the bit line of memory cells excluded from the threshold determination being set to the ground voltage (or the reference potential of the source line or the like). The number of memory cells that could cause the current Icc is gradually reduced by the lockout processing during application of the read voltage (verify voltage).

Figure 6:
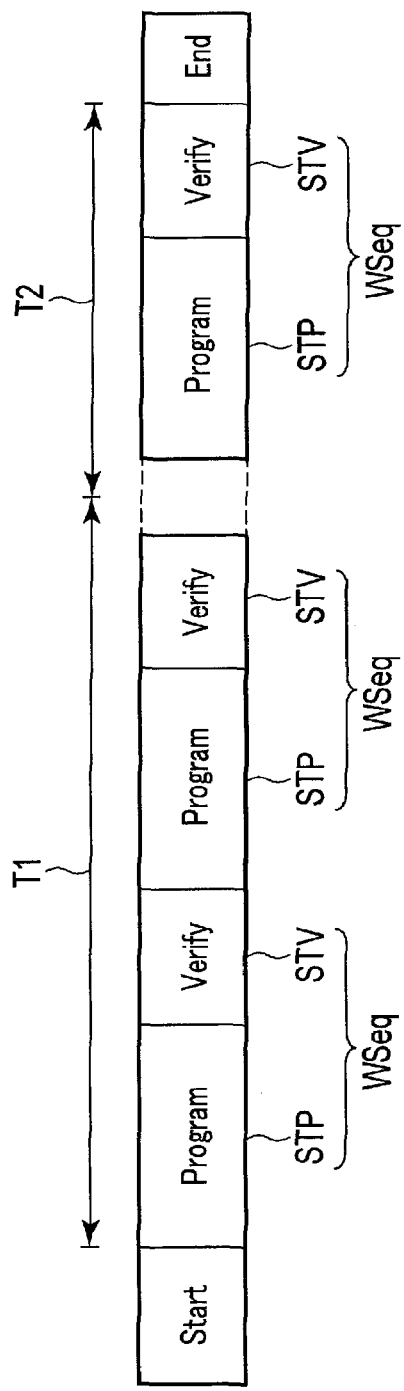
FIG. 6 is a schematic diagram illustrating writing of data into the semiconductor memory according to an embodiment.

FIG. 6 is a schematic diagram illustrating writing of data into the flash memory.

Writing of data into the flash memory is performed in units of pages. With a program voltage (write voltage) being applied to the word line (selected word line) to which the memory cell (selected cell) as the write target into is connected, the amount of charges in the charge storage layer of the memory cell MC is changed and the threshold (threshold state, threshold voltage) of the memory cell is changed.

For the memory cells (non-selected cells) MC into which no data is written, the potentials of the word line WL and the bit line BL are controlled during application of the write voltage to prevent the amount of charges of the charge storage layer of the memory cell MC from changing. Thus, a non-selected voltage (write non-selected voltage) is applied to the word line (non-selected word line) to which the non-selected cell is connected. When data is written, of the two select gate transistors of each memory unit MU, the select gate transistor STD on the bit line side (drain side) is turned on and the select gate transistor STS on the source line side (source line side) is turned off.

During writing data of the flash memory 100, as shown in FIG. 6, a step (hereinafter, called a program step) STP in which the program voltage is applied to the selected word line and a step (hereinafter, called a verify step) STV in which the write state of the memory cell is verified are performed alternately between the start of writing and the end of writing.

In the present embodiment, one write sequence Wseq includes one program step STP and one verify step STV. A write sequence Wseq is repeatedly performed a plurality of times until thresholds of all memory cells connected to the selected word line reach the value corresponding to data to be written. In the present embodiment, the repetition of a write sequence of the plurality of times when data is written once is called a write loop.

The threshold of a memory cell is shifted to a state corresponding to data to be written as shown below by the program step STP of the write operation of data.

Figure 7:
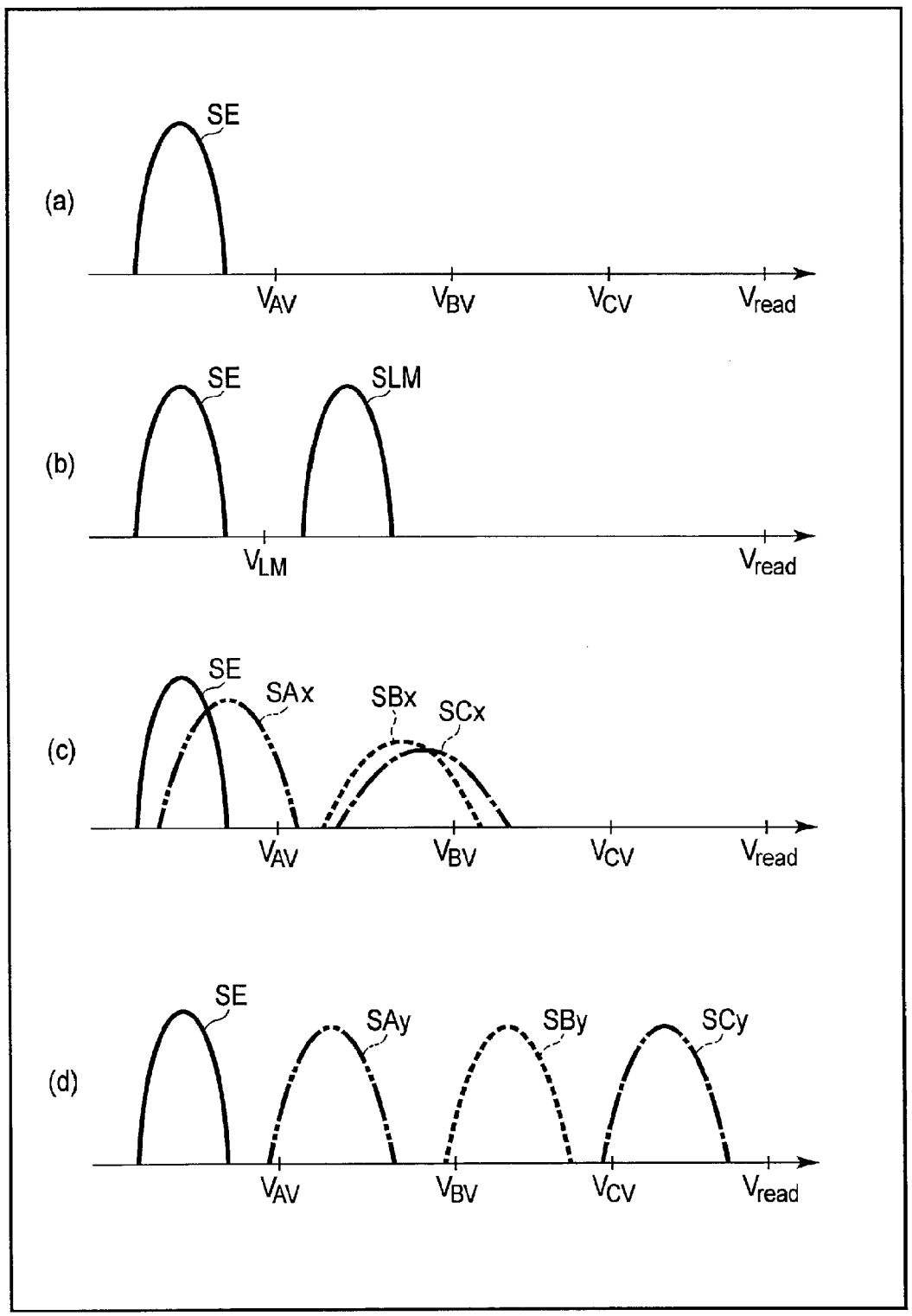
FIG. 7 is schematic diagrams illustrating writing of data into the semiconductor memory according to an embodiment.

FIG. 7 shows states of change of the threshold of a memory cell when data is written into a flash memory.

As shown in (a) of FIG. 7, the threshold state of the memory cell MC before data is written is the E state SE.

If data is written into a flash memory by, for example, the Lower at Middle method (LM method), as shown in (b) of FIG. 7, the threshold of the memory cell MC for writing lower-order data is set to one of the E state SE and the LM state SLM.

After the lower data is written, upper data is written by the program step STP. The threshold of the memory cell MC for each state is shifted simultaneously to write upper data. For example, the threshold of the selected memory cell among memory cells of the E state is shifted to the threshold corresponding to the A state. Thresholds of selected memory cells from among memory cells of the LM state are each shifted to thresholds corresponding to the B state and the C state.

In the initial stage of writing upper data (a certain period T1 after starting to write data), as shown in (c) of FIG. 7, excluding a memory cell MC-E in which data of the E state SE is stored, thresholds SAx, SBx, SCx of most memory cells do not reach the threshold (state) corresponding to data to be written.

By repeating the application of the program voltage to the word line WL, the threshold of the memory cell is gradually raised.

In the final stage of writing data (a certain period T2 after the period T1), as shown in (d) of FIG. 7, the thresholds SAy, SBy, SCy of the most memory cells MC shift to within the range of each state corresponding to data to be stored. Most of memory cells MC-A, MC-B, MC-C into which data of the A, B, and C states is to be written respectively have a threshold larger than each reading level to discriminate each state (data to be stored). Each memory cell in the final stage of writing data has a threshold state approximated in FIG. 4.

When writing of data is completed, the thresholds of all the normal memory cells MC are within the range of voltage corresponding to data to be stored by each of the memory cells MC.

Thus, writing (program step) of data into the flash memory is performed such that the threshold of the memory cell MC is shifted to the voltage value corresponding to data to be stored.

In the present embodiment, the initial stage T1 of writing data is, for example, the first half of the write loop. As a more concrete example, the initial stage T1 of writing data is assumed to be a period in which the write sequence is performed once to about three times after starting to write data during a write operation of upper data. The final stage T2 of writing data is, for example, the second half of the write loop. As a more concrete example, the final stage T2 of writing data is assumed to be a period in which the write sequence is performed once to about three times immediately before the end of writing data during a write operation of upper data.

The verify step (program verify) STV while writing data is performed after the program step STP.

In the verify step STV, for example, the verify control circuit 39 performs a verify operation. By the verify operation, whether the threshold of the memory cell MC during writing data has reached the threshold (state) corresponding to the data to be written is determined.

In the initial state of the verify operation, the potential of each bit line BL is set to the voltage VDDSA (>VSS) by the verify control circuit 39.

If the memory cell MC is turned on by a determination voltage value (hereinafter, called a verify level) for the verify operation, a current is generated in the bit line BL. The threshold of the memory cell turned on during the verify operation has not yet reached the threshold corresponding to data to be written. If the memory cell MC is turned off by the verify level (determination voltage value) in the verify operation, the charged state of the bit line BL is maintained. The memory cell that is turned off during the verify operation has already reached the threshold corresponding to data to be written. Thus, the verify operation is similar to the read operation of data. In the present embodiment, that the threshold of e memory cell has not yet reached the threshold (state) corresponding to data to be written in the verify operation is called verify fail. That the threshold of e memory cell has reached the threshold (state) corresponding to data to be written in the verify operation is called verify pass.

For example, like reading of data, the verify operation includes twice read processing and lockout processing. The potential of the bit line BL to which the memory cell MC intended for lockout processing is connected is caused to transition from the voltage VDDSA to the ground voltage VSS (or the reference potential) by, for example, the verify control circuit 39.

A result of the verify operation is transferred to the data latch circuit 31 and the data holding state of the latch of the latch unit UT2 is updated.

FIG. 8 is a diagram showing an example of the data holding state of the data latch circuit when data is written.

As shown in FIG. 8, write data is held inside the latch unit UT2 during the write operation of the data until the write operation is completed. For example, upper data of 2-bit data is held inside the latch 311 and lower data is held inside the latch 312.

A verify result is transferred and stored in one or more latches in the latch unit UT2 during the verify step STV. The latch corresponding to the memory cell of verify fail holds a verify result of "0". The latch corresponding to the memory cell of verify pass holds a verify result of "1".

When writing of data is completed, all memory cells have a verify result of verify pass.

When writing of data (write loop) is completed, the state of the latches (DL1, DL2) 311, 312 is updated from a state holding data to be stored to a state holding information ("11" here) indicating the completion of writing of data.

In the present embodiment, for example, the holding state of write data in the latch unit UT2 is not rewritten by a verify result during a write loop.

The verify operation is an operation to determine the threshold of a memory cell. However, the determination processing of the threshold of a memory cell in the verify operation is different from the determination processing of a memory cell when data is read.

Figure 9:
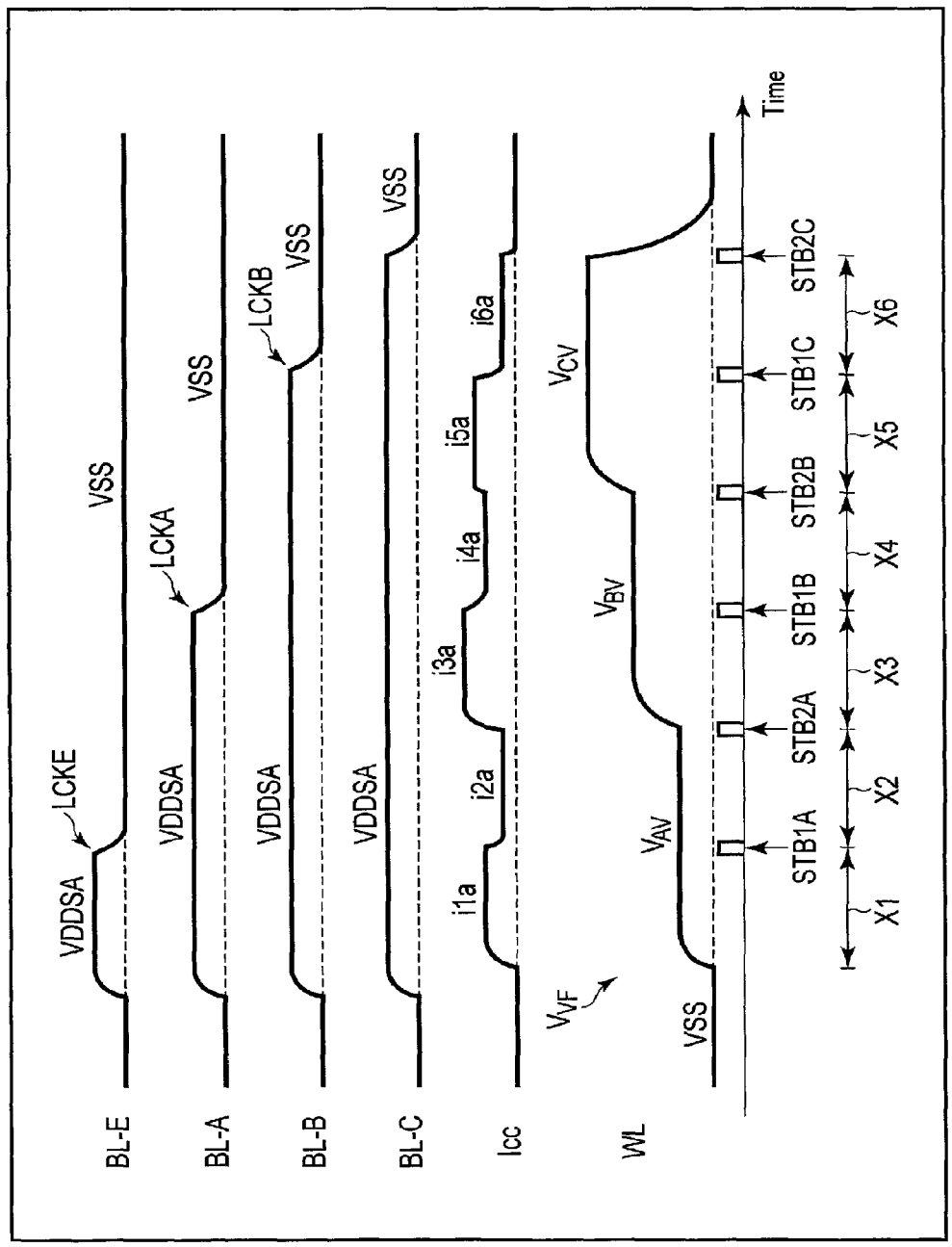
FIG. 9 is a timing chart illustrating a verify operation when data is written into the semiconductor memory according to the first embodiment.

FIG. 9 is a timing chart illustrating the verify operation of a flash memory according to the present embodiment. In FIG. 9, the potential of the bit line BL, the potential of the word line WL, and the current Icc generated in a memory cell array during a verify operation are shown.

A plurality of verify levels (determination voltage values) are set to determine the threshold state of the memory cell MC. Voltage values $V_{AV}$, $V_{BV}$, $V_{CV}$ between neighboring threshold distributions are used as verify levels. As shown in FIG. 4, the verify levels $V_{AV}$, $V_{BV}$, $V_{CV}$ in each state are higher than the reading levels $V_A$, $V_B$, $V_C$ in each state respectively.

When writing of data is performed simultaneously for a plurality of states, as shown in FIG. 9, the verify operation sequentially determines the threshold state of the memory cell MC in descending order of threshold corresponding to data to be written. The voltage values $V_{AV}$, $V_{BV}$, $V_{CV}$ of the verify voltage $V_{VF}$ to be applied to the word line WL during the verify operation gradually rise in accordance with the verify period of each state. For example, the threshold of each memory cell MC in the selected page is determined by the verify operation in the order from a low threshold (for example, the A state) to a high threshold (for example, the C state).

When, as shown in FIG. 9, the verification of different states is successively performed, a memory cell turned on at a low verify level (for example, the level $V_{AV}$) is also turned on at a higher verify level (for example, the levels $V_{BV}$, $V_{CV}$). Thus, the memory cell turned on at a low verify level does not have to be sensed at a higher verify level. Therefore, a portion of a plurality of memory cells in the page can be excluded from objects to be verified (read) by lockout processing based on some criterion during the verify operation.

The control of the verify operation can be exercised using data held in the data latch circuit 31.

The flash memory 100 according to the present embodiment controls the magnitude of the current Icc generated in the memory cell array by performing the verify operation based on data to be written into the memory cell.

The flash memory 100 according to the present embodiment controls the verify operation while data is written such that, among a plurality of the bit lines BL, the plurality of bit lines BL, each of which is connected to the memory cell MC into which the same data to be written (the memory cell MC whose threshold voltage is shifted to the same state), is controlled in the same potential state.

The flash memory 100 according to the present embodiment performs lockout processing based on data (state) stored in the data latch circuit 31 (latch unit UT2) and to be written during the verify operation.

Figure 10:
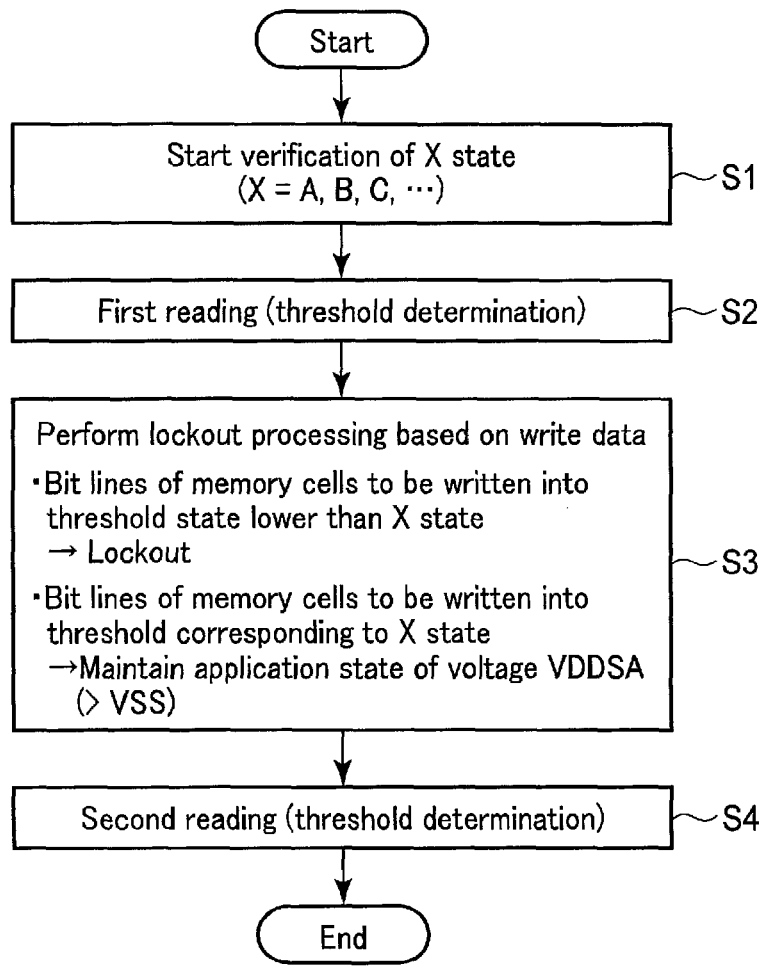
FIG. 10 is a flow chart illustrating the verify operation when data is written into the semiconductor memory according to the first embodiment.

FIG. 10 is a flow chart illustrating the verify operation of the flash memory according to the present embodiment.

After starting the verify operation of a certain state (step S1), the verify control circuit 39 makes, for example, a first threshold determination (step S2).

The verify control circuit 39 checks write data (data holding state of latches) in the latch unit UT2 together with the result of the first threshold determination to determine the memory cells MC intended for lockout processing at the verify level during the verification (step S3).

Memory cells into which data corresponding to a state verified at a level lower than the verify level of the current verification is written are locked out. The verify control circuit 39 applies the ground voltage VSS to the bit line BL of locked-out memory cells and applies the voltage VDDSA to all bit lines of memory cells to be verified.

The verify control circuit 39 makes a second threshold determination while the same potential is applied to all bit lines of memory cells as the verification target (step S4).

For example, when the B state is verified, the memory cells MC whose threshold is equal to the verify level $V_{BV}$ or less are turned on. When the B state is verified, the memory cells MC-E of the E state and the memory cells MC-A to be written into the A state are turned on. Among the memory cells MC-B to be written into the B state, memory cells having the threshold equal to the verify level $V_{BV}$ or lower (memory cells of verify fail) are turned on and memory cells having a threshold larger than the verify level $V_{BV}$ (memory cells of verify pass) are turned off.

In the first reading (threshold determination) during verification of the B state, the verify control circuit 39 performs lockout processing of the memory cells MC-E, MC-A of the E state and the A state based on data to be written into memory cells.

In the present embodiment, in the first reading (threshold determination) during verification of the B state, based on write data in the latch unit UT2, even if the memory cell MC-B to be written into the B state is verify fail (On state), the verify control circuit 39 does not perform lockout processing of the bit line BL-B of the memory cell MC-B of verify fail.

Accordingly, in the second reading during verification of the B state, without depending on verify results of the memory cells MC-B to be written into the B state, all bit lines BL of these memory cells MC-B are maintained in a state (charged state) in which the voltage VDDSA is applied.

During the second reading for verification of the B state, the potential of the bit lines BL of the memory cells MC-E, MC-A to be written into the E state and the A state respectively is set to the ground voltage VSS by the lockout processing.

Accordingly, the verification of the memory cells MC-B, MC-C to be written into states equal to the B state and upper than the B state is performed while a current caused by the potential of the bit lines BL of the locked-out memory cells MC-E, MC-A of the E and A states is reduced during verification of the B state. The generation of a current in the bit lines of the memory cells MC-B of the B state is detected by verification in this state. At this point, a current of the current value corresponding to the number of memory cells of verify fail among the memory cells MC-B of the B state flows to the source line SL as the current Icc in the memory cell array (block).

Also during verification of the A state, as in verification of the B state, lockout processing of bit lines of, among memory cells to be written into states equal to the A state or higher, memory cells of verify fail is not performed. Also during verification of the C state, lockout processing of bit lines of, among memory cells to be written into the C state, memory cells of verify fail is not performed.

In a flash memory according to the present embodiment, as described above, potential states of bit lines corresponding to memory cells into which the same data is to be written during verification of each state are the same without depending on the write state (threshold state of the memory cell) during program verification.

In the present embodiment, the bit lines BL of the memory cells MC to be written into the same state during the verify step (program verification) are frequently in the same potential state and adjacent to each other. Therefore, in the present embodiment, the influence of potential differences between neighboring bit lines can be mitigated for memory cells into which the same data is written during verification.

A flash memory according to the present embodiment is controlled such that the potential state of bit lines of memory cells whose threshold (state) should be determined during the verify operation is the same as the potential state of bit lines of memory cells whose threshold (state) should be determined during the read operation.

As a result, the flash memory according to the present embodiment can reduce sense noise during verification of each state so that threshold determination reliability can be improved.

Incidentally, instead of the verify control circuit 39, the internal control circuit (state machine) 8 may have a function to control lockout processing during the verify operation using data to be written in the present embodiment.

According to a semiconductor memory in the present embodiment, as described above, operational reliability can be improved.

(2) Operation Example

An operation example (control method) of a semiconductor memory according to the present embodiment will be described with reference to FIGS. 9 to 11. Here, FIGS. 1 to 8 are also used when appropriate to describe the operation example of the semiconductor memory according to the present embodiment.

A write command is sent from the memory controller 120 to the flash memory (semiconductor memory) 100. Write data DT and an address signal ADR are sent from the memory controller 120 to the flash memory 100.

The write data DT is transferred into the latch unit UT2 of the data latch circuit 31. If the memory cell MC can store 2-bit data, the upper 1 bit (upper data) of 2 bits is stored in the latch 311 of the latch unit UT2 and the lower 1 bit (lower data) of 2 bits is stored in the latch 312 of the latch unit UT2.

The row (page) and the column of the memory cell array (block) are each selected by the address signal ADR.

As shown in (b) of FIG. 7, after writing of lower-order data (lower page) is performed, writing of higher-order data (upper page) is performed.

When upper data is written, writing (shift operation of the threshold of the memory cell) of the A state, the B state, and the C state is performed simultaneously.

In the program step STP of writing data (write loop), a program voltage of a certain magnitude is applied to the word line (selected word line) WL indicated by the row address. Also, a non-selection voltage (write passing voltage) is applied to word lines (non-selected word lines) other than the selected word line. Together with the potential control of the word line WL, the select gate transistor STD on the drain side of each memory unit MU is turned on and the potential of the bit lines BL are controlled.

After the program step STP, the verify step STV including each step shown in FIG. 10 is performed. FIG. 10 is a flow chart illustrating the verify operation of the flash memory according to the present embodiment when data is written.

When the verify step STV is started, as shown in FIG. 9, the voltage VDDSA is applied to the bit line BL connected to the memory cell MC in the selected page in the initial state of the verify operation to charge each bit line BL. Also, the sense node ndSEN in the sense unit UT1 is charged. The two select gate transistors STD, STS of each memory unit MU are turned on during the verify operation.

The verify voltage $V_{VF}$ including each verify level is applied to the word line WL. The voltage value (verify level) of the verify voltage $V_{VF}$ is sequentially increased in the order of verification of the A state, the B state, and the C state.

In the initial stage (first half of the write loop) of writing data into the flash memory 100, as shown in (c) of FIG. 7, most of the memory cells MC into which data should be written have not yet reached the threshold corresponding to data to be written. Most of the memory cells MC in the selected page PG have a threshold lower than the threshold corresponding to data to be written.

In the verify step STV, as shown in FIG. 10, verification of the memory cell MC-A of the A state is started (step S1). Here, the threshold state of memory cells to be written into the A state or higher is discriminated.

The verify level $V_{AV}$ for verification of the A state is applied to the selected word line WL and the first reading (threshold determination) in the verification of the A state is performed (step S2).

After the verify level $V_{AV}$ in the verification of the A state is applied, memory cells having a threshold equal to the applied voltage $V_{AV}$ or lower are turned on and memory cells having a threshold larger than the voltage $V_{AV}$ are turned off.

In accordance with On/Off of the memory cell, a current (cell current) flows to the bit line BL and the sense node ndSEN. The generation of a current (potential fluctuations) in the sense node ndSEN is sensed. In accordance with On/Off of the memory cell, the current Icc is generated in the memory cell array and flows between the sense unit UT1 (bit line BL) and the source line SL. A current value i1a of the current Icc corresponds to the number of memory cells turned on by the verify level $V_{AV}$.

In the verification of the A state, the memory cell MC-E of the E state is turned on by the verify level $V_{AV}$ and, among the memory cells MC-A to be written into the A state, memory cells of verify fail are turned on. Memory cells of verify pass among the memory cells MC-A to be written into the A state and the memory cells MC-B, MC-C to be written into the B state and the C state respectively are turned off. In the initial stage of writing data, the number of memory cells turned on during verification of the A state is about half of all memory cells in the selected page if, for example, randomize processing is performed.

The verify result is introduced into the latch unit UT2 in a period X1 from the start of application of the voltage value $V_{AV}$ to time STB1. The verify result ("0" or "1") is held in some latch of the latch unit UT.

At time STB1 during verification, write data stored in the latch unit UT2 is checked by the verify control circuit 39. Based on the check result of write data, lockout processing of memory cells to be written into states lower than the state to be verified is performed by the verify control circuit 39 (or the internal control circuit 8) (step S3). Bit lines corresponding to locked-out memory cells are caused to transition from the state in which the voltage VDDSA is applied to the state in which the ground voltage VSS is applied.

In the present embodiment, based on write data in the latch unit UT2 (and the verify result), the memory cells MC of verify fail among the memory cells MC turned on by the verify voltage $V_{AV}$ are excluded from lockout processing and the lockout processing of the memory cells MC of the E state is performed. The potential of the bit line BL-E of the memory cell MC-E of the E state is set to the ground voltage VSS (or the reference potential).

For selective lockout processing of the bit line of the memory cell MC-E of the E state, for example, arithmetic processing of write data in the latch unit UT2 and a verify result (sense result) is performed. A control signal generated from the write data and the verify result is stored in the latch inside the latch unit UT2. On/Off of the transistors P1, N1, N2 in the sense unit is controlled by the control signal.

In the present embodiment, regardless of the verify result of the memory cell MC of the state (here, the A state) to be verified, none of the memory cells MC to be written into the A state is locked out during verification of the A state. Thus, all the bit lines BL of the memory cells MC-A to be written into the A state are maintained in an application state (charged state) of the voltage VDDSA during verification of the A state. Incidentally, the bit lines BL-B, BL-C of the memory cells MC-B, MC-C to be written into the B state and the C state respectively are also maintained in an application state (charged state) of the voltage VDDSA.

With only the memory cells MC-E of the E state in an On state being locked out, a current caused by the memory cells MC of the E state is reduced. In the present embodiment, therefore, in a period X2 after the lockout processing during verification of the A state, the current Icc of a current value i2a in accordance with the number (for example, about ¼ of the total number of memory cells in the page) of the memory cells (memory cells in an On state) of verify fail flows between the source line SL and each bit line BL. For example, the current value i2a is smaller than the current value i1a.

In the period X2 from time STB1A to time STB2A, second reading of memory cells to be written into the A state is performed (step S4).

The verify result of the A state after the lockout processing is introduced into the latch unit UT2. In a period after time STB1A, only the memory cells MC-E of the E state are locked out and thus, all the memory cells MC-A to be written into the A state are intended for the second reading for verification. Also, the memory cells MC to be written into the B state or the C state are intended for the second reading.

Thus, like data reading of the memory cells MC-A of the state A during verification of the A state, all the bit lines BL-A of the memory cells MC-A to be written into the A state are matched to substantially the same potential state.

In a flash memory in which memory cells of verify fail are locked out based on a verify result of the A state, the current value of the current Icc in the period X1 has a magnitude (<i1a) in accordance with the number of memory cells of verify fail in the E state or the A state turned on by the verify level $V_{AV}$ and the current value of the current Icc in the period X2 corresponds to the number of memory cells of the A state determined to be turned off in the period X1 and so is extremely small.

In the verify step STV, as described above, verification of one state among verifications for a plurality of states (verify levels) performed successively is completed. Then, substantially the same operation as the verification of the A state is continued until the verification of all states is completed.

The verification of the B state is successively performed after the verification of the A state. The potential of the selected word line WL rises from the verify level $V_{AV}$ to the verify level $V_{BV}$. The threshold state of memory cells to be written into the B state or higher is discriminated by the verify level $V_{BV}$ during verification of the B state.

The memory cells MC of the E state have been locked out during verification of the B state. Thus, when the verification of the B state is started, the memory cells MC-A, MC-B, MC-C to be written into the A state, the B state, and the C state respectively are verified by using the verify level $V_{BV}$.

In the present embodiment, the memory cells (memory cells of verify fail) MC-A turned on during verification of the A state have not been locked out when the verification of the B state is started. Thus, in a period from time STB1A to time STB1B, all memory cells of the A, B, and C states are to be sensed. When the verification of the B state is started in FIG. 10, the current Icc has a current value i3a in accordance with the number (for example, about ¾ of all memory cells in the selected page) of memory cells in an On state of the memory cells MC-A, MC-B, MC-C of the A state, the B state, and the C state respectively. In a period X3 from time STB1A to time STB1B, the current value of the current Icc rises from the current value i2a to the current value i3a.

A verify result by the first reading is sampled in the latch unit UT2 at the timing of time STB1B during verification of the B state.

In a period X4 from time STB1B until the verification of the B state is completed, lockout processing LCKA is performed on the memory cells MC-A to be written into the A state based on write data in the latch unit UT2 (and the verify result) by processing that is almost the same as lockout processing LCKE on the memory cells of the E state. The potential of the bit line BL-A connected to the memory cell MC-A is caused to transition from the voltage VDDSA to the voltage VSS by the lockout processing LCKA of the A state.

In the first reading by the verify level $V_{BV}$, the lockout processing on the memory cell MC-B of verify fail of the B state is not performed based on write data even if a memory cell in an On state (memory cell of verify fail) is detected from among the plurality of memory cells MC-B to be written into the B state. Thus, in the verification of the B state, the bit lines BL-B of the memory cells MC-B to be written into the B state are maintained in an application state of the voltage VDDSA.

At time STB2B, the verify result of the B state is introduced by the second reading. Objects to be verified in the second reading of the B state include all the memory cells MC-B to be written into the B state and all the memory cells MC-C to be written into the C state.

After the lockout processing LCKA on the memory cell MC-A of the A state is performed in the verification of the B state, a current value i4a of the current Icc becomes a magnitude in accordance with the number of memory cells in an On state and to be written into the B state and the number of memory cells in an On state and to be written into the C state. In the period X4 from time STB1B to time STB2B, for example, memory cells of about half the number of all memory cells in the selected page are turned on and the current Icc decreases from the current value i3a to the current value i4a between the start and the end of the verification of the B state.

In a flash memory in which lockout processing on memory cells of verify fail is performed based on a verify result of the B state, the current value of the current Icc in the period X3 has a magnitude (<i3a) in accordance with the number of memory cells to be written into the B state and memory cells to be written into the C state and memory cells of verify pass in the verification of A state, and the current value of the current Icc in the period X4 has a magnitude (<i4a) in accordance with the number of memory cells exceeding the verify level $V_{BV}$ among memory cells to be written into the B state and C state.

Thus, like the read operation of the memory cells MC-B of the state B during verification of the B state, all the bit lines BL-B of the memory cells MC-B to be written into the B state are matched to substantially the same potential state.

The verification of the C state is successively performed after the verification of the B state. The potential of the selected word line WL rises from the verify level $V_{BV}$ to the verify level $V_{CV}$.

When the verification of the C state is started, the memory cells MC-E, MC-A of the E state and the A state have already been locked out. Thus, when the verification of the C state is started, the memory cells MC-B, MC-C to be written into the B state and the C state respectively are verified by using the verify level $V_{CV}$.

In the present embodiment, when the verification of the C state is started, the memory cells MC-B of verify fail during verification of the B state are not locked out. In a period from time STB2B to time STB1C, all memory cells of the B and C states are to be sensed. Thus, when the verification of the state C in FIG. 9 is started, the current Icc has a current value i5a in accordance with the number (for example, about half of all memory cells in the selected page) of memory cells turned on at the voltage $V_{of}$ of the B state or the C state. For example, the current value i5a is equal to the current value i4a or more.

In the period X5 from the start of the verification of the C state to time STB1C, verification by the verify level $V_{CV}$ is performed and a verify result is sampled at time STB1C.

After time STB1C, lockout processing LCKB on the memory cells MC-B to be written into the B state is performed based on write data in the latch unit UT2 (and the verify result). Accordingly, the potential of the bit line BL-B connected to the memory cell MC-B is set to the ground voltage Vss.

The lockout processing on the memory cells MC-C of verify fail is not performed based on write data even if a memory cell in an On state (memory cell of verify fail) is detected from among the plurality of memory cells MC-C to be written into the C state by the verify level $V_{CV}$. Thus, in the verification of the C state, all the bit lines BL-C of the memory cells MC-C to be written into the C state are maintained in an application state of the voltage VDDSA.

Objects for the second reading at time STB2C of the verification are all the memory cells MC-C to be written into the C state regardless of the verify result sampled at time STB1C.

Thus, after the lockout processing LCKB is performed on the memory cells MC-B of the B state during verification of the C state, a current value i6a of the current Icc becomes a magnitude in accordance with the number of the memory cells MC-C in an On state and to be written into the C state. In a period X6 between time STB1C and time STB2C, for example, memory cells of about ¼ of all memory cells in the selected page are turned on and the current Icc decreases from the current value i5a to the current value i6a.

In a flash memory in which lockout processing is performed on memory cells of verify fail based on a verify result of the C state, the current value i5a of the current Icc in the period X5 is a magnitude (<i4a) in accordance with the total number (number less than half the number of all memory cells) of the number of memory cells of verify pass in the B state and the number of memory cells of verify fail in the C state. In addition, the current value i6a of the current Icc in the period X6 becomes an extremely small value in accordance with the number of memory cells of verify pass in the C state.

As a result of the verify result in the highest state (here, the C state) being introduced, the completion of the verify step STV is determined.

In this manner, the verify step STV in the initial stage of the program operation of the flash memory is completed. Based on the obtained verify result, the program voltage VPGM and the potential of the bit line BL for the next program step STP are controlled.

The program step STP and the verify step STV are repeatedly performed a plurality of times and writing of data into the flash memory proceeds to the final stage.

FIG. 11 is a timing chart illustrating the verify operation in the final stage (second half of the write loop) of writing data into the flash memory according to the present embodiment. In FIG. 11, a timing chart of the potential of each bit line BL, the potential of the selected word line WL, and changes of the current Icc generated inside the memory cell array 1 is shown.

The control of the verify operation in the final stage T2 of writing data is substantially the same as the control of the verify operation in the initial stage.

However, in the final stage of writing data, as shown in (d) of FIG. 7, most of the memory cells MC to be programmed reach the threshold corresponding to data to be written and are in almost the same state as the state after the write operation is completed (state for reading data). Thus, most of the memory cells MC in the selected page have a threshold higher than the verify level corresponding to data to be written.

As a result, the magnitude (current waveform) of the current Icc in the memory cell array 1 generated during verification of each state in the final stage is different from the magnitude (current waveform) of the current Icc generated during verification of each state in the initial stage.

In the verification of the A state in the final stage, the thresholds of most of the memory cells MC-A to be written into the A state are larger than the verify level $V_{AV}$. Thus, memory cells turned on by the verify level $V_{AV}$ are only the memory cells MC-E of the E state and most of the memory cells MC-A to be written into the A state are not turned on.

A current value i1z of the current Icc in a period Z1 before lockout processing on memory cells of the E state during verification of the A state substantially corresponds to the number of the memory cells MC-E of the E state.

After lockout processing LCK on memory cells of the E state is performed during verification of the A state, the current Icc that is minute in accordance with the number of memory cells that have turned on is generated.

As a result, a current value i2z of the current Icc in a period Z2 (from time STB1A to time STB2A) after the lockout processing LCKE is performed on memory cells of the E state during verification of the A state in the final stage becomes smaller than the current value i2a of the current Icc in the initial stage. If all the memory cells MC-A are memory cells of verify pass, the current Icc is hardly generated after the lockout processing of the memory cells MC-E of the E state.

In the verification of the B state in the final stage, the thresholds of most of the memory cells MC-B to be written into the B state are larger than the verify level $V_{BV}$. Thus, most of memory cells turned on by the verify level $V_{BV}$ are the memory cells MC-A of the A state and most of the memory cells MC-B to be written into the B state are not turned on.

A current value i3z of the current Icc in a period Z3 (from time STB2A to time STB1B) before the lockout processing LCKA on memory cells of the A state during verification of the B state substantially corresponds to the number of the memory cells MC-A to be written into the A state. For example, the current value i3z has substantially the same magnitude as the current value i1z. However, the current value i3z may have a different magnitude from the current value i1z.

After the lockout processing LCKA on the memory cells MC-A of the A state is performed during verification of the B state, the current Icc that is minute in accordance with the number of memory cells that have turned on is generated.

As a result, a current value i4z of the current Icc in a period Z4 (from time STB1B to time STB2B) after the lockout processing LCKA is performed on the memory cells MC-A of the A state during verification of the B state becomes smaller than the current value i4a of the current Icc in the initial stage. If all the memory cells MC-B are memory cells of verify pass, the current Icc is hardly generated after the lockout processing of the memory cells MC-A of the A state. For example, the current value i4z has approximately the same magnitude as the current value i2z.

In the verification of the C state in the final stage, the thresholds of most of the memory cells MC-C to be written into the C state are larger than the verify level $V_{CV}$. Thus, memory cells turned on by the verify level $V_{CV}$ are only the memory cells MC-B to be written into the B state and most of the memory cells MC-C to be written into the C state are not turned on.

A current value i5z of the current Icc in a period Z5 (from time STB2B to time STB1C) before the lockout processing LCKB on memory cells of the B state during verification of the C state corresponds to the number of the memory cells MC-B to be written into the B state.

After the lockout processing LCK on memory cells of the B state is performed during verification of the C state, the current Icc that is minute in accordance with the number of memory cells (memory cells of verify fail) that have been turned on by the verify level $V_{CV}$ is generated.

As a result, a current value i6z of the current Icc in a period Z6 (from time STB1C to time STB2C) after the lockout processing LCKB is performed on the memory cells MC-B of the B state during verification of the C state becomes smaller than the current value i6a of the current Icc in the initial stage. For example, the current value i6z has approximately the same magnitude as the current value i2z. If all the memory cells MC-C are memory cells of verify pass, the current Icc is hardly generated after the lockout processing of the memory cells MC-B of the B state.

Thus, as a result of the threshold of each memory cell being shifted to a magnitude corresponding to data to be written, the waveform (magnitude) of the current Icc in the final stage of writing data is different from the waveform (magnitude) of the current Icc in the initial stage of writing data.

Almost none of the memory cells MC are turned on during verification of each state in the final stage and thus, the current value of the current Icc generated during verification in the final stage tends to become smaller than the current value of the current Icc during verification in the initial stage.

Incidentally, reading of data of a flash memory according to the present embodiment can be performed by known technology based on the above basic operation.

When data is written into a flash memory according to the present embodiment, potential states of bit lines corresponding to memory cells to be verified (memory cells to be written into the same state) during verification of each state while writing data are the same regardless of verify results. Accordingly, when data is written into a flash memory according to the present embodiment, the potential state of the bit line of the memory cell intended for threshold determination during the verify operation is the same as the potential state of the bit line of the memory cell intended for threshold determination during the read operation. Also, the bit lines BL of the memory cells MC to be written into the same state during the verify step (program verification) are frequently in the same potential state and adjacent to each other. Therefore, in the present embodiment, the influence of potential differences between neighboring bit lines can be mitigated for memory cells into which the same data is written during verification.

As a result, when data is written into the flash memory according to the present embodiment, sense noise during verification of each state can be reduced so that threshold determination reliability can be improved.

As has been described above, the semiconductor memory in the present embodiment and the control method thereof can improve memory reliability.

(B) Second Embodiment

A semiconductor memory according to the second embodiment will be described with reference to FIGS. 12 and 13.

A writing method of data into a semiconductor according to the second embodiment is different from the writing method of data into a semiconductor according to the first embodiment. Lockout processing during the verify step of a flash memory according to the present embodiment is performed, as in the first embodiment, in units of data to be written.

Figure 12:
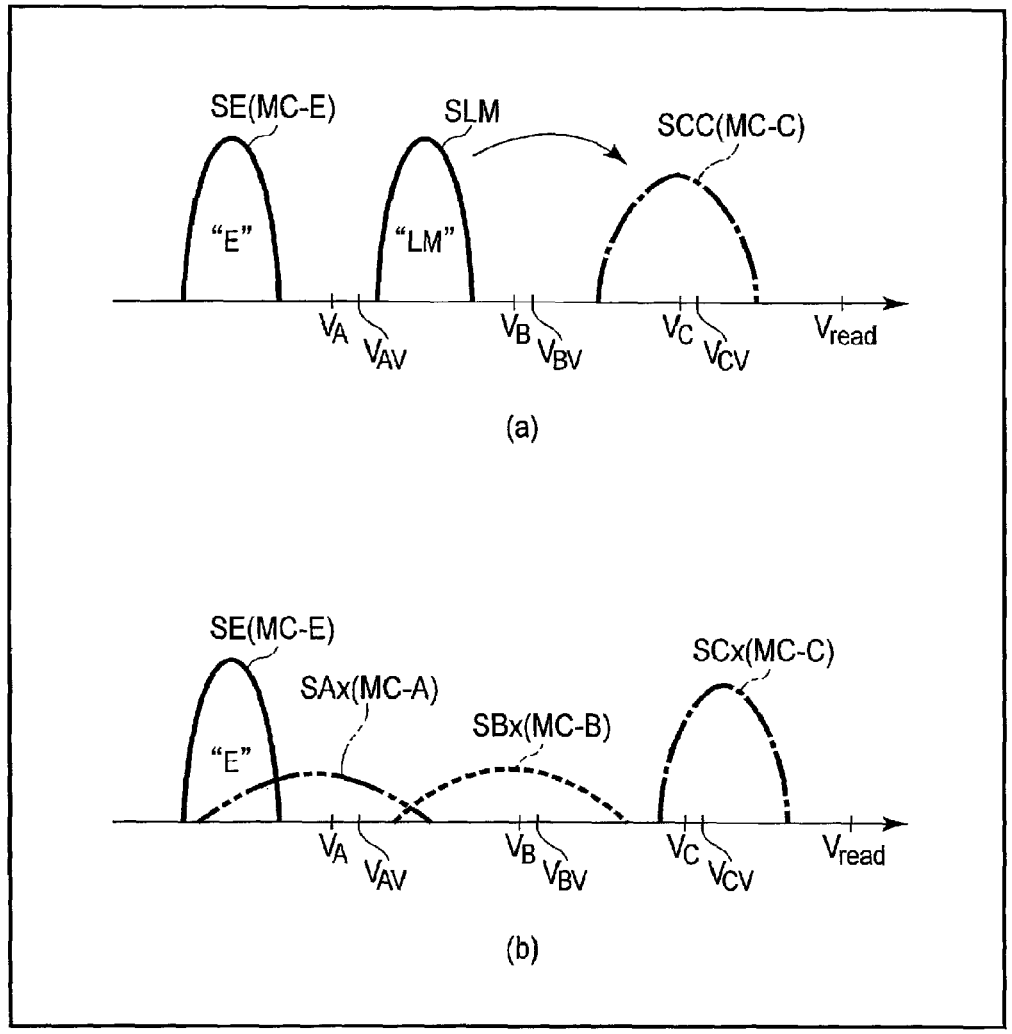
FIG. 12 is schematic diagrams illustrating writing of data into the semiconductor memory according to a second embodiment.

FIG. 12 is a schematic diagram showing an example of the writing method of data used for a flash memory according to the present embodiment.

(a) and (b) of FIG. 12 are schematic diagrams illustrating writing of higher-order data. (a) and (b) of FIG. 12 show threshold states of a memory cell in the initial stage of the write loop when upper data is written.

In the present embodiment, as shown in (a) of FIG. 12, after lower data (LM state SLM) is written, among memory cells of the LM state SLM, a rough program of the C state is executed and the threshold of the memory cell MC-C to be written into the C state is shifted to a range within a distribution SCC. Accordingly, the memory cell MC to be written into the C state is set to a rough writing state concerning the C state. The threshold of the memory cell MC to be written into the C state is shifted to a value (for example, a value equal to the verify level $V_{BV}$ or more) near the threshold corresponding to the C state by the rough program.

As shown in (b) of FIG. 12, programs of the A state and the B state are executed together with a fine program of the C state. The threshold of the memory cell MC-E of the E state is shifted to the threshold corresponding to the A state and the threshold of the memory cell of the LM state is shifted to the threshold corresponding to the B state. Accordingly, the program step of the memory cells MC-A, MC-B, MC-C to be written into the A state, the B state and C state respectively is performed.

FIG. 13 is a timing chart illustrating the verify operation of a flash memory according to the present embodiment. In FIG. 13, waveforms of each voltage and current in the verify step in the initial stage of the program operation of the flash memory according to the present embodiment are shown.

As shown in FIG. 13, after the potential VDDSA is applied to the bit line BL, the verify voltage $V_{VF}$ is applied to the selected word line WL.

In the initial stage of the write loop, memory cells MC having a threshold equal to the verify level $V_{AV}$ or less are turned on by application of the verify level $V_{AV}$ of the A state.

In the period X1 from the application of the verify level $V_{AV}$ of the A state to lockout processing of the E state, the current Icc is generated by the memory cell MC in an On state. The current Icc in the period X1 has a current value i1b.

In the initial stage of the write loop, as shown in (b) of FIG. 12, most of the memory cells to be written into the A state have not yet reached the threshold corresponding to data to be written.

In the present embodiment, the memory cells MC-E of the E state and the memory cells MC-A of the A state of verify fail are turned on by application of the verify level (voltage value) $V_{AV}$.

In this case, the threshold of the memory cell MC-B to be written into the B state is shifted from a memory cell of the LM state SLM. Further, before the program step of the A state and the B state, the memory cells MC-C to be written into the state C are put into a rough writing state. Therefore, when the A state is verified, the memory cells MC-B to be written into the B state and the memory cells MC-C to be written into the C state are not turned on.

Therefore, in the period X1, the current Icc has the value i1b in accordance with the number of memory cells of the E state and memory cells of verify fail concerning the state A.

The maximum value of the current value i1b can take a value in accordance with the total number of the number of the memory cells MC-E of the E state and the number of the memory cells MC-A to be written into the A state in the selected word line.

A current value i2b of the current Icc in the period X2 is smaller than the current value i1b in the period X1 due to the lockout processing LCKE on the memory cells MC-E of the state E. The current value i2b in the period X2 corresponds to the number of the memory cells MC of the A state turned on by the voltage value $V_{AV}$ (memory cells MC of verify fail concerning the A state).

The magnitude of the verify voltage $V_{VF}$ is increased from the voltage value $V_{AV}$ to the voltage value $V_{BV}$ for the verification of memory cells to be written into the B state or higher. Accordingly, among the memory cells MC-A, MC-B to be written into the A state and the B state respectively, memory cells having a threshold equal to the voltage value (verify level) $V_{BV}$ or less are turned on. For example, most of the memory cells to be written into the C state have a threshold larger than the voltage value $V_{BV}$ due to the rough program concerning the C state. Thus, most of the memory cells to be written into the C state are not turned on during verification of the B state.

For example, a current value i3b of the current Icc in the period X3 corresponds to the total of the number of all the memory cells MC-A to be written into the A state and the number of memory cells of verify fail concerning the B state. The current value i3b has a magnitude equal to that of the current value i2b or more. The maximum value of the current value i3b can take a value in accordance with the total of the number of the memory cells MC-A to be written into the A state and the number of the memory cells MC-B to be written into the B state in the selected word line.

A current value i4b of the current Icc in the period X4 becomes equal to the current value i3b or less by the lockout processing LCKA of the A state being performed. For example, the current value i4b corresponds to the number of the memory cells MC of verify fail concerning the B state. The current value i4b of the current Icc in the period X4 may have a magnitude approximately equal to that of the current value i2b of the current Icc in the period X2.

After the verification of the B state, the voltage value of the verify voltage $V_{VF}$ is set to the voltage value $V_{CV}$. Accompanying changes in magnitude of the verify voltage $V_{VF}$, the current value of the current Icc changes from the current value i4b to a current value i5b.

The current value i5b in the period X5 corresponds to the total number of the number of all the memory cells MC-B to be written into the B state and the number of the memory cells MC-C of the C state of verify fail.

In the present embodiment, the threshold of the memory cells MC-C to be written into the C state is shifted in a rough writing state before the thresholds of memory cells to be written into the A state and the B state being shifted. Thus, regarding the memory cell MC-C to be written into the C state, thresholds of relatively many memory cells is higher than the voltage value $V_{CV}$ as the verify level. For example, in the initial stage of the write loop, most of the memory cells MC-C to be written into the C state may be memory cells of verify pass. In such a case, the current value i5b does not depend on the memory cell MC-C to be written into the C state and has a value in accordance with the number of all the memory cells MC-B to be written into the B state. For example, the current value i5b of the current Icc is smaller than the current value i3b and equal to the current value i4b or more.

The magnitude of the current Icc in the period X6 is a current value i6b after the lockout processing LCKB of the B state being performed. The magnitude of the current value i6b corresponds to the number of the memory cells MC-C of the C state of verify fail. For example, the current value i6b is smaller than the current value i5b. As a more concrete example, the current value i6b is equal to the current value i4b or less. Further, the current value i6b is smaller than the current value i2b and may substantially be zero.

After the verification of the C state, the verify voltage $V_{VF}$ is set to 0 V to complete the verify step.

In a flash memory to which a writing method that is different from the writing method of a flash memory according to the first embodiment is applied, as described above, the current Icc generated during the verify step in the initial stage of the program operation of the flash memory according to the second embodiment changes as shown in FIG. 13 in accordance with the threshold state of a memory cell.

Incidentally, in a flash memory to which the writing method according to the present embodiment is applied, the waveform of the current Icc generated during the verify step in the final stage of the program operation of the flash memory is substantially the same as the waveform of the current Icc shown in FIG. 11.

As has been described above, a semiconductor memory according to the second embodiment can achieve substantially the same effect as in the first embodiment.

(C) Third Embodiment

A semiconductor memory according to the third embodiment will be described with reference to FIGS. 14 and 15.

A writing method of data into a semiconductor according to the third embodiment is different from the writing method of data into a semiconductor according to the first embodiment. Lockout processing during the verify step of a flash memory according to the present embodiment is performed, like in the first embodiment, in units of data to be written.

Figure 14:
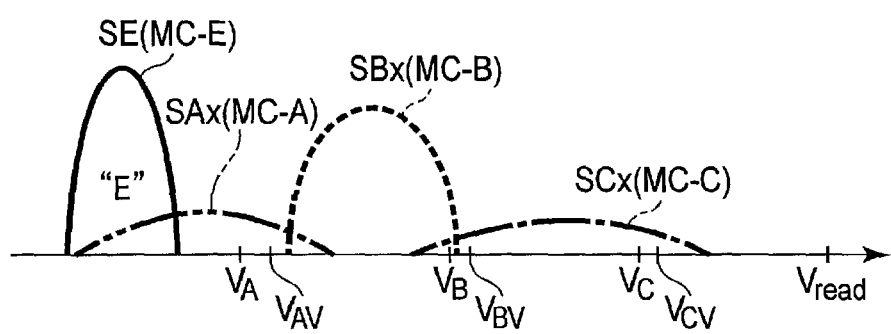
FIG. 14 is a schematic diagram illustrating writing of data into the semiconductor memory according to a third embodiment.

FIG. 14 is a schematic diagram showing an example of the writing method of data used for a flash memory, according to the present embodiment.

FIG. 14 is a schematic diagram illustrating writing of upper data. FIG. 14 is a schematic diagram illustrating writing of upper data. FIG. 14 shows a threshold state of a memory cell in the initial stage of the write loop when upper data is written.

As shown in FIG. 14, after lower data (LM state) is written, writing of the A state and writing of the C state are performed substantially simultaneously to write upper data. The threshold of the selected memory cell of the memory cells MC-E of the E state is shifted to the threshold corresponding to the A state. The threshold of the selected memory cell of memory cells of the LM state is shifted to the threshold corresponding to the C state.

In this case, the voltage value of the program voltage and the potential of the bit line are set to values appropriate for writing of the A state and the C state. Accordingly, the amount of shift of the threshold of the memory cell MC-B to be written into the B state when the program voltage is applied can be reduced compared with the amount of shift of the threshold of the memory cells MC-A, MC-C to be written into the A state and the C state respectively. Therefore, the writing speed of the A state and the C state is faster than the writing speed of the B state.

As a result, programs for the A state and the C state are executed substantially simultaneously. The program for the B state is completed later than the programs for the A state and the C state.

Figure 15:
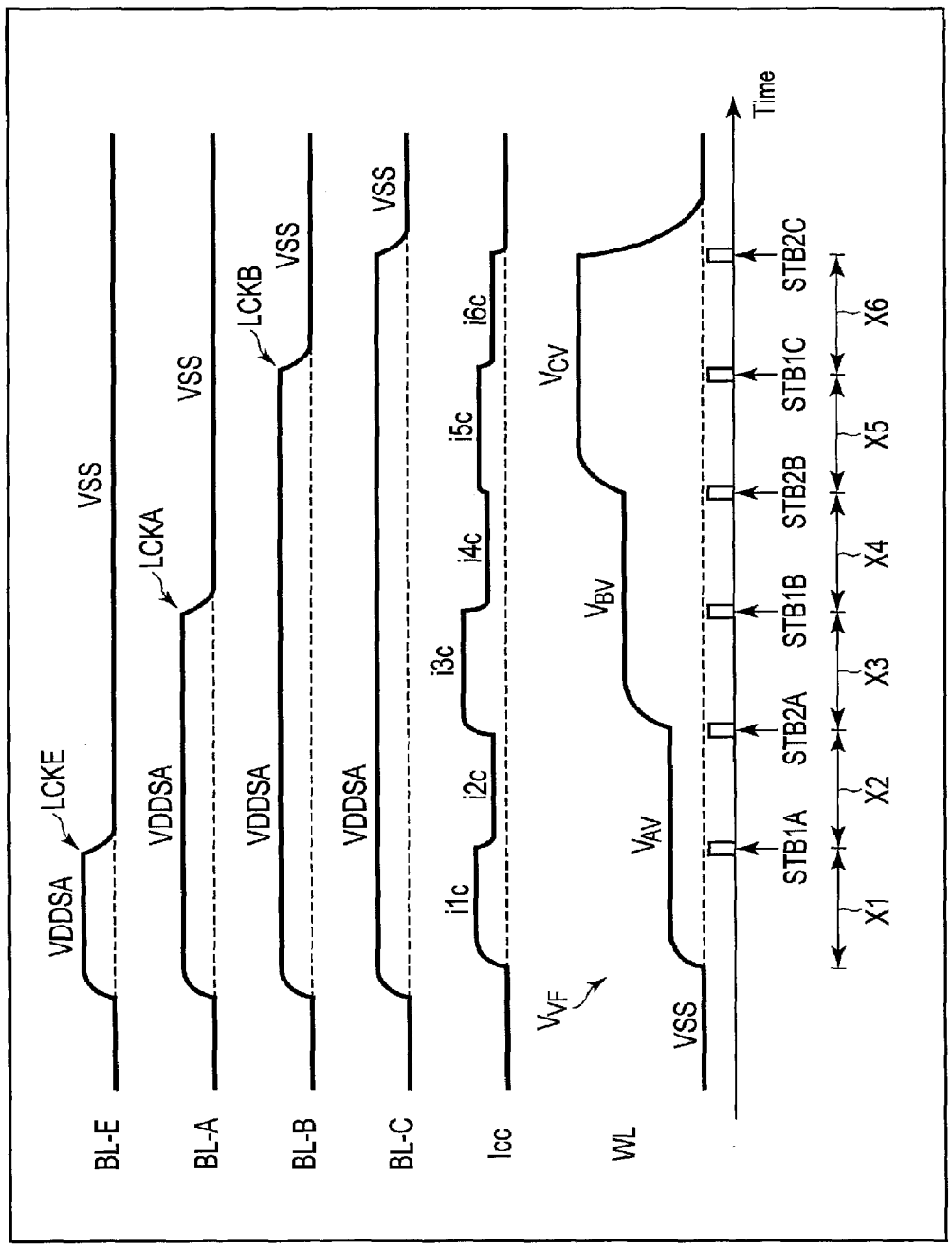
FIG. 15 is a timing chart illustrating the verify operation when data is written into the semiconductor memory according to the third embodiment.

FIG. 15 is a timing chart illustrating the verify operation of a flash memory according to the present embodiment. In FIG. 15, waveforms of each voltage and current in the verify step in the initial stage of the program operation of the flash memory according to the present embodiment are shown.

As shown in FIG. 15, after the potential VDDSA is applied to the bit line BL, the verify voltage V is applied to the selected word line WL.

In the initial stage of the write loop, most of memory cells to be written into the A state have not yet reached the threshold corresponding to data to be written.

In the initial stage, therefore, the memory cells MC-E of the E state and the memory cells MC-A of the A state of verify fail are turned on in the period X1 from the application of the verify level $V_{AV}$ of the A state to the lockout processing of the E state. In the period X1, the current Icc has a current value i1c in accordance with the number of the memory cells MC-E of the E state and the memory cells MC-A of verify fail concerning the state A.

The current Icc in the period X2 is changed from the current value i1c to a current value i2c, which is smaller than the current value i1c, by the lockout processing LCKE on the memory cells MC-E of the E state. The current value i2c of the current Icc in the period X2 has a value in accordance with the number of the memory cells MC-A of the A state of verify fail.

The magnitude of the verify voltage $V_{VF}$ is increased from the verify level $V_{AV}$ to the verify level $V_{BV}$ for the verification of memory cells to be written into the B state or higher.

In the present embodiment, the program for the memory cells MC-B of the B state is hardly executed in the initial stage. Thus, when the verify voltage $V_{VF}$ is applied, most of the memory cells MC-B of the B state have a threshold equal to the verify level $V_{BV}$ or less.

Therefore, memory cells causing the generation of the current Icc in the period X3 are the memory cells MC-A to be written into the A state and most of the memory cells MC-B to be written into the B state. In this case, a current value i3c in the period X3 has a magnitude in accordance with the number (total number) of the memory cells MC-A to be written into the A state and the number of memory cells of verify fail among the memory cells MC-B to be written into the B state. For example, the current value i3c is equal to the current value i1c or more. However, the current value i3c may be smaller than the current value i1c and equal to the current value i2c or so in accordance with the threshold state of memory cells to be written into the B state.

The maximum value of the current value i3c is a value in accordance with the total of the number of the memory cells MC-A to be written into the A state and the number of the memory cells MC-B to be written into the B state.

The current caused by the memory cells MC-A in an On state in the period X4 is reduced by the lockout processing LCKA of the A state being performed. In the present embodiment, as described above, most of the memory cells MC-B to be written into the B state have a threshold equal to the verify level $V_{BV}$ or less. Thus, a current value i4c of the current Icc in the period X4, substantially, has a value in accordance with the number of memory cells to be written into the B state. For example, the current value i4c is smaller than the current value i3c and larger than the current value i2c. Incidentally, the current value i4c may have a value equal to the current value i1c or less. For example, the number of memory cells contributing to the current value i4c is about ¼ of the total number of memory cells connected to the selected word line.

The magnitude of the verify voltage $V_{VF}$ is increased from the verify level $V_{BV}$ to the verify level $V_{CV}$.

In the period X5, as shown in FIG. 14, most of the memory cells MC-C to be written into the C state have not yet reached the threshold corresponding to data to be written in the initial stage of the write loop.

Thus, a current value i5c of the current Icc in the period X5 has a value in accordance with the total of the number of all the memory cells MC-B to be written into the B state and the number of the memory cells MC-C of the C state of verify fail. For example, the current value i5c is equal to the current value i1c or less and equal to the current value i4c or more. As a more concrete example, the current value i5c is smaller than the current value i3c.

The current value of the current Icc is reduced by the lockout processing LCKB of the B state being performed. A current value i6c of the current Icc in the period X6 corresponds to the number of the memory cells MC-C of the C state of verify fail. The current value i6c is smaller than the current value i5c and about as large as, for example, the current value i2c. As a concrete example, the current value i6c may have a value equal to that of the current value i4c or less.

After the verification of the C state, the verify voltage $V_{VF}$ is set to 0 V to complete the verify step.

In a flash memory to which a writing method that is different from the writing method of a flash memory according to the first embodiment is applied, as described above, the current Icc generated during the verify step in the initial stage of the program operation of the flash memory according to the third embodiment changes as shown in FIG. 15 in accordance with the threshold state of a plurality of memory cells.

Incidentally, in a flash memory to which the writing method according to the present embodiment is applied, the waveform of the current Icc generated during the verify step in the final stage of the program operation of the flash memory is substantially the same as the waveform of the current Icc shown in FIG. 11.

As has been described above, a semiconductor memory according to the third embodiment can achieve substantially the same effect as in the first embodiment.

(D) Fourth Embodiment

A semiconductor memory according to the fourth embodiment will be described with reference to FIGS. 16 and 17.

A writing method of data into a flash memory according to the fourth embodiment is different from the writing method of data into a flash memory according to the first embodiment. Lockout processing during the verify step of a flash memory according to the present embodiment is performed, like in the first embodiment, in units of data to be written.

FIG. 16 is a schematic diagram showing an example of the writing method of data used for a flash memory according to the present embodiment.

FIG. 16 is a schematic diagram illustrating writing of upper data. FIG. 16 shows a threshold state of a memory cell in the initial stage of the write loop when upper data is written.

As shown in FIG. 16, after lower data (LM state) is written, the programs for the A state and the B state are executed substantially simultaneously. The threshold of the memory cell selected from the memory cells MC-E of the E state is shifted to the threshold corresponding to the A state and the threshold of the memory cell selected from memory cells of the LM state is shifted to the threshold corresponding to the B state.

In this case, the voltage value of the program voltage and the potential of the bit line are set to values appropriate for writing of the A state and the B state. As a result, the amount of shift of the threshold of memory cells to be written into the C state can be reduced compared with the amount of shift of the threshold of memory cells to be written into the A state or the B state. Accordingly, the writing speed of the A state and the B state is faster than the writing speed of the C state.

As a result, the programs for the A state and the B state are executed substantially simultaneously. The program for the C state is completed later than the programs for the A state and the B state.

FIG. 17 is a timing chart illustrating the verify operation of a flash memory according to the present embodiment. In FIG. 17, changes of each voltage and current in the verify step in the initial stage of the program operation of the flash memory according to the present embodiment are shown.

As shown in FIG. 17, after the potential VDDSA is applied to the bit line BL, the verify voltage $V_{VF}$ is applied to the selected word line WL.

In the initial stage of the write loop, as shown in FIG. 16, most of the memory cells to be written into the A state have not yet reached the threshold corresponding to data to be written. Therefore, the memory cells MC-E of the E state and the memory cells MC-A of the A state of verify fail are turned on by application of the verify level $V_{AV}$ of the A state in the period X1 from the start of the A state to the lockout processing LCKE of the E state.

In the period X1, the current Icc having a current value i1$d$ is generated by memory cells in an On state. For example, the maximum value of the current value i1$d$ can take a value in accordance with the total of the number of the memory cells MC-E of the E state and the number of the memory cells MC-A to be written into the A state in the selected word line.

The current value i2$d$ of the current Icc in the period X2 is a value smaller than the current value i1$d$ in the period X1 due to the lockout processing LCKE on memory cells of the state E. For example, the current value i2$d$ in the period X2 corresponds to the number of memory cells of the A state turned on by the verify level $V_{AV}$.

The magnitude of the verify voltage $V_{VF}$ changes from the verify level $V_{AV}$ to the verify level $V_{BV}$ for the verification of memory cells to be written into the B state or higher.

Accordingly, among the memory cells MC-A, MC-B to be written into the A state and the B state respectively, memory cells having a threshold equal to the verify level $V_{BV}$ or less are turned on.

If, like in the present embodiment, the amount of shift of the threshold of memory cells to be written into the C state is smaller than the amount of shift of the threshold of memory cells to be written into the A state or the B state when the program voltage is applied, as shown in FIG. 16, most of the memory cells MC-C to be written into the C state may have a threshold equal to the verify level $V_{BV}$ or less.

Thus, a current value i3$d$ of the current Icc in the period X3 has a value in accordance with the total of the number of the memory cells MC-A to be written into the A state, the number of memory cells of verify fail among the memory cells MC-B to be written into the B state, and the number of memory cells having a threshold equal to the verify level $V_{BV}$ or less among the memory cells MC-C to be written into the C state. For example, the current value i3$d$ is a value almost the same as the current value i1$d$.

The magnitude of the current Icc in the period X4 is reduced from the current value i3$d$ to the current value i4$d$ by the lockout processing LCKA of the A state. The current value i4$d$ in the period X4 corresponds to the total number of the number of the memory cells MC-B of the B state of verify fail and the number of memory cells having a threshold equal to the verify level $V_{BV}$ or less among the memory cells MC-C to be written into the C state. For example, the current value i4$d$ is smaller than the current value i3$d$ and equal to the current value i2$d$ or more.

The verify voltage $V_{VF}$ is raised from the voltage value $V_{BV}$ to the voltage value $V_{CV}$ for the verification of the C state. Accordingly, the current value of the current Icc has a current value i5$d$ in the period X5.

In the present embodiment, as described above, the threshold of the memory cells MC-C to be written into the C state is hardly shifted from the threshold state of the LM state. Thus, during the verification of the C state, most of the memory cells MC-C to be written into the C state have a threshold smaller than the verify level $V_{CV}$.

Therefore, when the voltage value of the verify voltage $V_{VF}$ is set to the verify level $V_{CV}$, in addition to the memory cells MC to be written into the B state, most of the memory cells MC-C to be written into the C state are turned on.

In this case, the current value i5$d$ in the period X5 corresponds to the number of all the memory cells MC-B to be written into the B state and the number of the memory cells MC-C of the C state of verify fail. In the present embodiment, the magnitude of the current value i5$d$ is larger than that of the current value i3$d$ in the period X5 during verification of the C state.

The current value of the current Icc in the period X6 is reduced from the current value i5$d$ to a current value i6$d$ by the lockout processing LCKB of the B state.

In the period X6, most of the memory cells MC-C to be written into the C state have a threshold equal to the verify level (voltage value) $V_{CV}$ or less.

Thus, the current Icc in the period X6 has the current value i6$d$ in accordance with the number of memory cells of verify fail among the memory cells MC-C to be written into the C state. In the present embodiment, the current value i6$d$ has a magnitude of current generated when memory cells of about ¼ among all memory cells in the selected page are turned on. For example, the current value i6$d$ is equal to the current value i4$d$ or less and equal to the current value i2$d$ or more. As a more concrete example, the current value i6$d$ is larger than the current value i2$d$.

After the verification of the C state, the verify voltage $V_{VF}$ is set to 0 V to complete the verify step.

In a flash memory to which a writing method that is different from the writing method of a flash memory according to the first embodiment is applied, as described above, the current Icc generated during the verify step in the initial stage of the program operation of the flash memory according to the fourth embodiment changes as shown in FIG. 17 in accordance with the threshold state of a memory cell.

Incidentally, in a flash memory to which the writing method according to the present embodiment is applied, the waveform of the current Icc generated during the verify step in the final stage of the program operation of the flash memory is substantially the same as the waveform of the current Icc shown in FIG. 11.

As has been described above, a semiconductor memory according to the fourth embodiment can achieve substantially the same effect as in the first embodiment.

(E) Modifications

Modifications of a flash memory according to an embodiment will be described with reference to FIGS. 18 to 22.

Here, modifications of a flash memory according to an embodiment will be described by taking a flash memory according to the first example as an example. However, each modification below can also be applied to flash memories according to the second to fourth embodiments.

Figure 18:
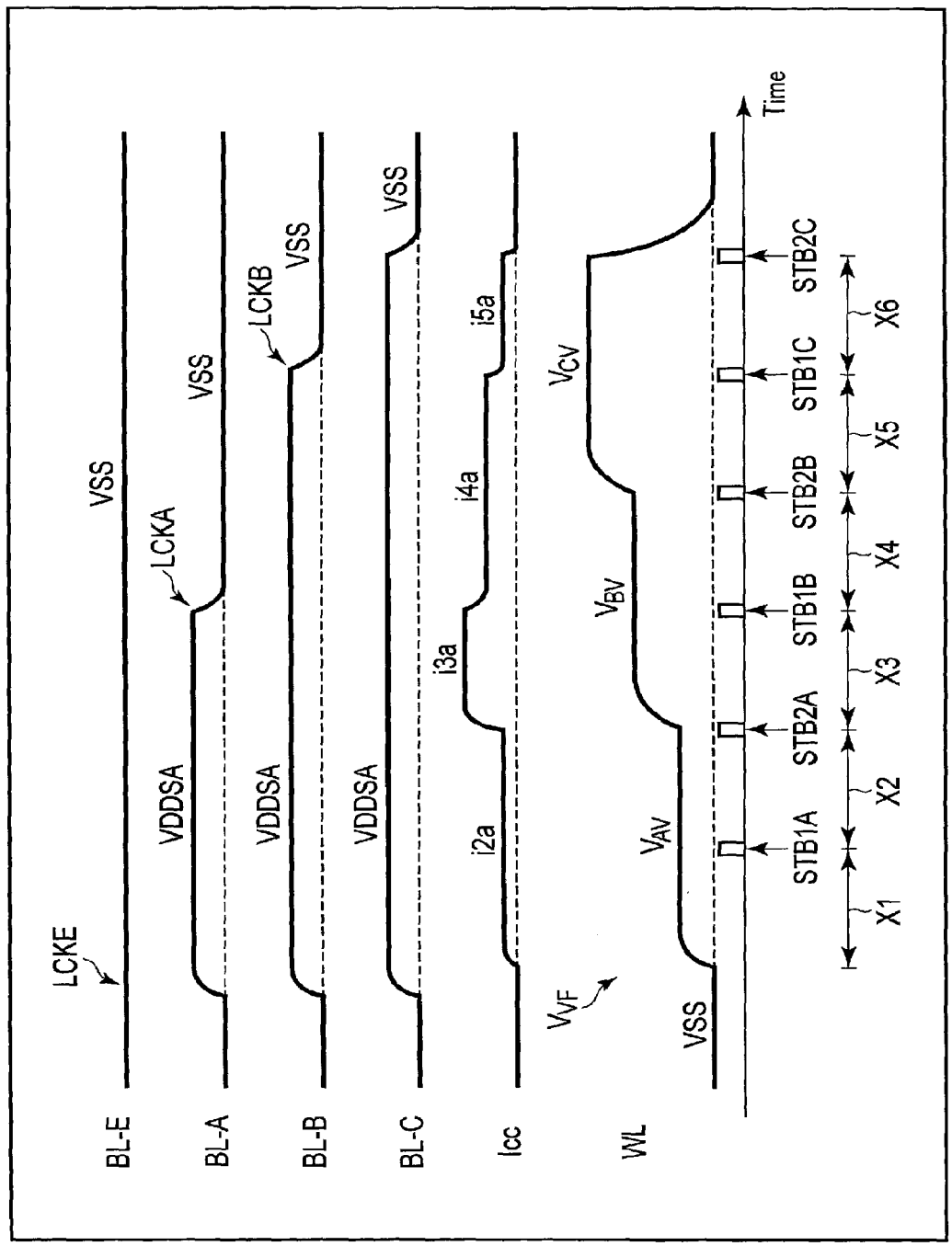
FIG. 18 is a schematic diagram illustrating a modification of the semiconductor memory according to an embodiment.

FIG. 18 is a timing chart for the verify operation illustrating a modification of a flash memory according to an embodiment.

In the above description, lockout processing on memory cells of the E state is performed during the verify operation (during determination of the A state).

Memory cells of the E state have a threshold in an erased state and thus, writing of data into memory cells of the E state is not performed.

Therefore, as shown in FIG. 18, the bit line BL-E of memory cells of the E state may have been locked out when the verify operation is started (when the verification of the A state is started).

In this case, the potential of the bit line BL-E of the memory cell MC-E of the E state is set to the ground voltage VSS in the entire period during verification of the A state.

Therefore, a current value i2a of the current Icc has a magnitude in accordance with the number of the memory cells MC of verify fail concerning the A state during verification of the A state.

In addition to memory cells of the E state, the memory cells MC-A to be written into the A state may also be locked out before application of the verify voltage.

FIG. 19 is a timing chart for the verify operation illustrating a modification of a flash memory according to an embodiment.

As shown in FIG. 19, the timing for performing the lockout processing LCKA, LCKB of the A state and the B state respectively may be the timing when the voltage value (verify level) of the verify voltage $V_{VF}$ changes.

The lockout processing LCKE of the E state is performed before application of the verify level $V_{AV}$.

For example, the lockout processing LCKA on the memory cells MC-A to be written into the A state is performed in synchronization with the timing when the verify voltage $V_{VF}$ changes from the level $V_{AV}$ to the level $V_{BV}$.

In this case, a current value i1x of the current Icc has a value in accordance with the number of memory cells of verify fail among memory cells to be written into the A state in an application period XA (the period X1 and the period X2) of the verify level $V_{AV}$.

For example, the lockout processing LCKB on the memory cells MC-B to be written into the B state is performed in synchronization with the timing when the verify voltage $V_{VF}$ changes from the level $V_{BV}$ to the level $V_{CV}$.

In this case, a current value i2x of the current Icc has a value in accordance with the total of the number of memory cells of verify fail among memory cells to be written into the B state and the number of memory cells having a threshold voltage equal to the level $V_{BV}$ or less among memory cells to be written into the C state in an application period XB (the period X3 and the period X4) of the verify level $V_{BV}$. The current value i2x is equal to the current value i1x or more.

A current value i3x of the current Icc has a value in accordance with the number of memory cells of verify fail among memory cells to be written into the C state in an application period XC (the period X5 and the period X6) of the verify level $V_{CV}$. For example, the current value i3x is equal to the current value i2x or less.

If, as shown in FIG. 19, the lockout processing LCKA, LCKB is performed at the timing of change of the voltage value of the verify voltage $V_{VF}$, reading in each state for verification may be performed only once.

If the read operation in each state is performed only once, a flash memory according to the present modification can reduce the period of verification of each state.

Figure 20:
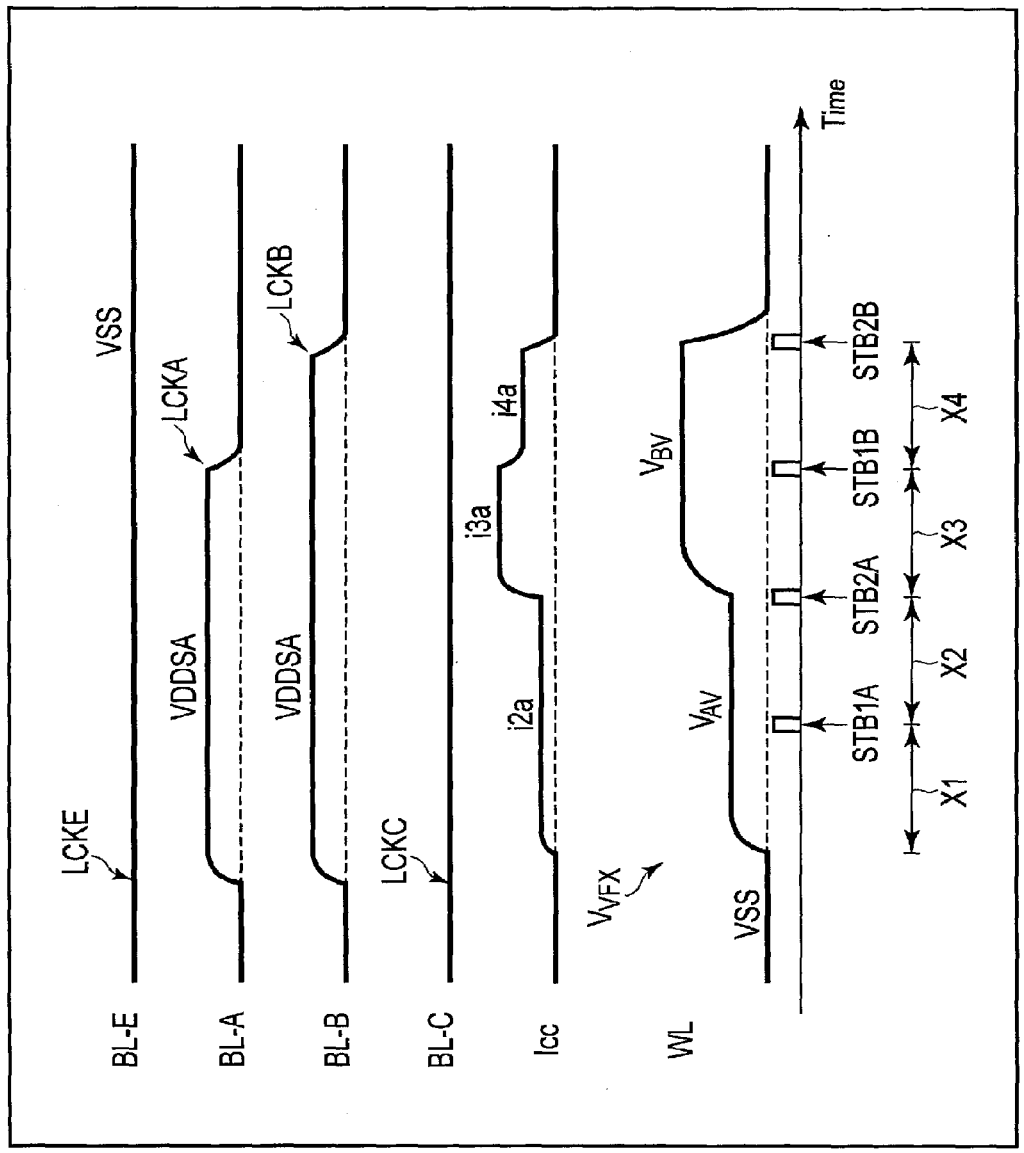
FIG. 20 is a schematic diagram illustrating a modification of the semiconductor memory according to an embodiment.
Figure 21:
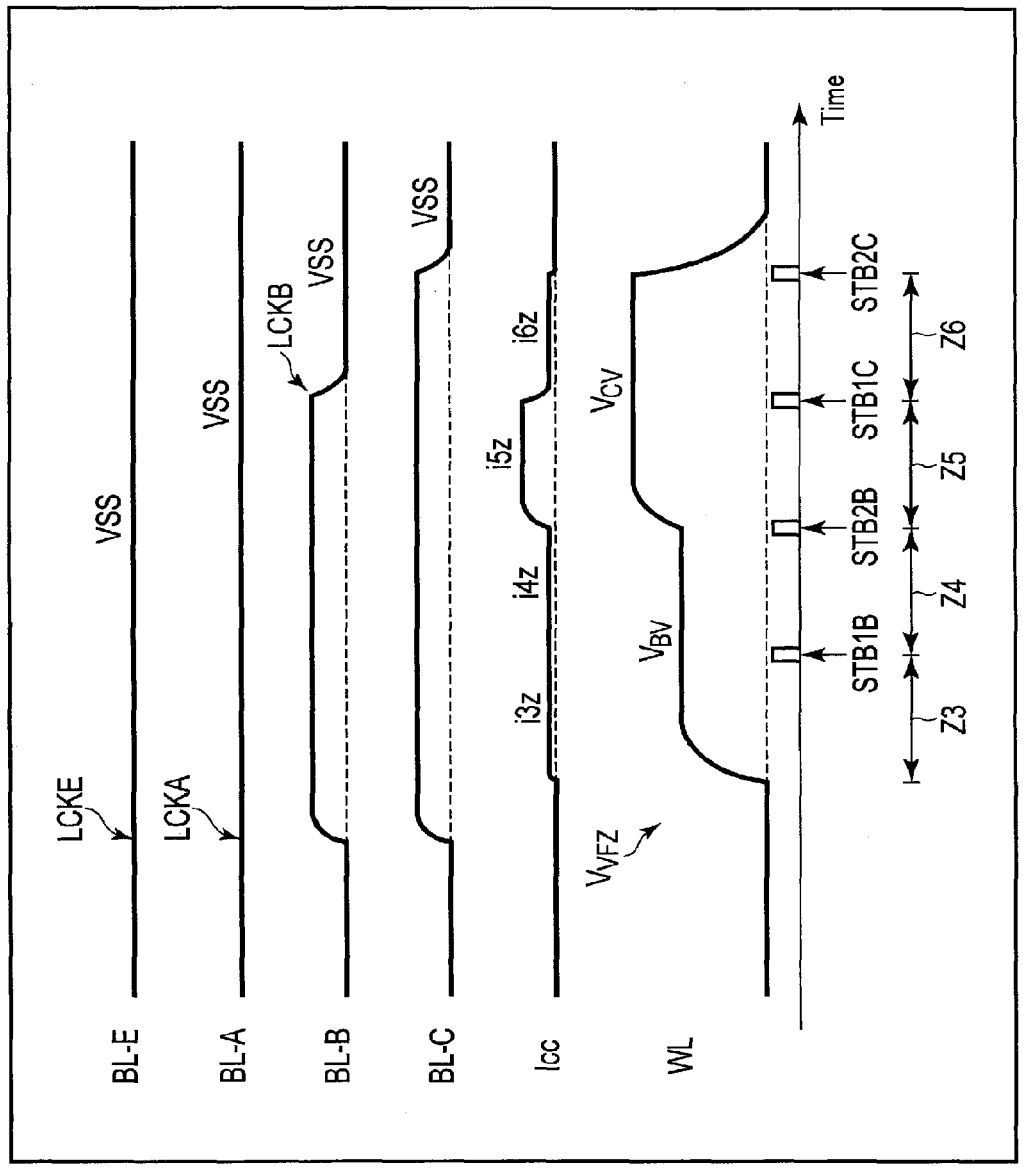
FIG. 21 is a schematic diagram illustrating a modification of the semiconductor memory according to an embodiment.

FIGS. 20 and 21 are timing charts for the verify operation illustrating a modification of a flash memory according to an embodiment.

As shown in FIGS. 20 and 21, verification of a certain state may be skipped (omitted) in accordance with the stage of the write loop.

In the initial stage of the write loop, as shown, for example, in (c) of FIG. 7, most of the memory cells to be written into the C state have not yet shifted to within a range of the threshold corresponding to the C state.

Thus, as shown in FIG. 20, verification of the C state may not be performed in the initial stage of the write loop.

In this case, the lockout processing LCKC on the memory cells MC-C to be written into the C state is performed before application of the verify voltage $V_{VFX}$. The verify voltage $V_{VFX}$ does not include the verify level (determination voltage value) $V_{CV}$ for verification of the C state.

Also, in the final stage of the write loop, writing of most of memory cells to be written into the A state is completed.

Thus, as shown in FIG. 21, in the final stage of the write loop, the lockout processing LCKA of the A state may be performed before application of the verify voltage $V_{VFZ}$ so that the verification of the A state is omitted.

In this case, the lockout processing LCKA on the memory cells MC-A to be written into the A state is performed before application of the verify voltage $V_{VFZ}$. The verify voltage $V_{VFZ}$ does not include the verify level (determination voltage value) $V_{AV}$ for verification of the A state.

As shown in FIGS. 20 and 21, a flash memory according to the modification can reduce the period of program verification by a portion of verification of a certain state being skipped in accordance with the stage of the write loop.

FIG. 22 is a diagram illustrating a modification of a flash memory according to an embodiment. In FIG. 22, the relationship between each state (threshold distribution) and the verify level of a memory cell is shown.

In a flash memory described by using FIGS. 4 to 8, the program operation is performed by the LM method.

The verify operation of a flash memory according to the present embodiment can be applied to a flash memory of the program method (shift method of the threshold of memory cells) such as the quick pass write (QPW) method or the full sequence method.

Depending on the method of the program operation, the verify level (determination voltage value) used for the verify operation differs.

In a flash memory of, for example as shown in FIG. 22, the quick pass write method, two verify levels are set to one write state.

In the verify operation of a flash memory of the quick pass write method, the twice reading method in each state and lockout processing in units of write data may be performed at verify levels $V_{AVL}$, $V_{BVL}$, $V_{CVL}$ on the lower level side of each state.

To make the verify operation more efficient in a flash memory having the writing method of FIG. 22, verification of each of the A state and the B state may be performed by reading twice using two verify levels and verification of the C state may be performed by reading once (for example, only reading at time STB2C) using the verify level $V_{CV}$.

The semiconductor memory described by using FIGS. 18 to 22 can achieve, together with each effect described in the modifications, substantially the same effect as the semiconductor memory described by using FIGS. 1 to 17.

(F) Supplementary Examples

Supplementary examples of a semiconductor memory according to an embodiment will be described using FIGS. 23 and 24.

Figure 23:
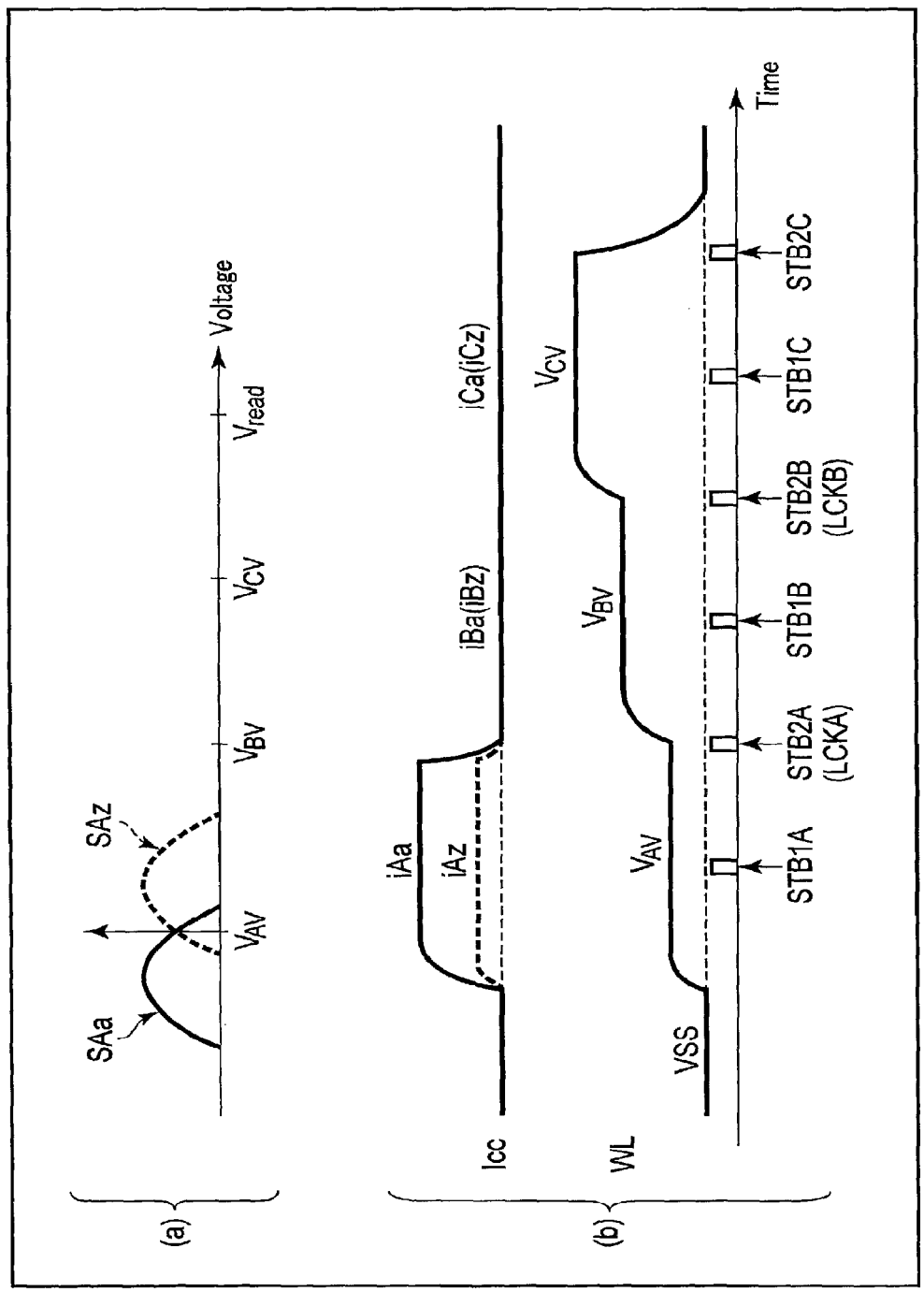
FIG. 23 is schematic diagrams illustrating a supplementary example of the semiconductor memory according to an embodiment.

FIG. 23 is a schematic diagram illustrating the verify operation of a flash memory according to the present embodiment when data corresponding to the A state is written into all memory cells of the selected page.

(a) of FIG. 23 shows distributions SAa, SAz of the threshold state of memory cells in the initial stage (first half of the write loop) and the final stage (second half of the write loop) of writing data.

(b) of FIG. 23 is a timing chart showing changes in the potential of the selected word line and changes in the current Icc in a memory cell array during the verify step.

As shown in the distribution (solid line distribution) SAa in (a) of FIG. 23, most of the memory cells to be written into the A state are turned on by the verify level $V_{AV}$.

Thus, as shown in (b) of FIG. 23, regarding the current (solid line waveform) Icc in the initial stage of writing data, the current Icc has a current value iAa in accordance with the number of memory cells that are turned on (memory cells of verify fail) during verification of the A state. Because lockout processing based on write data is performed, the memory cells MC-A do not depend on a verify result during verification of the A state and are not locked out. When all memory cells are written into the A state, lockout processing of memory cells of the E state may not be performed.

The lockout processing LCKA is performed on all the memory cells MC-A to be written into the A state based on write data during verification of the B state and the C state.

Thus, if all memory cells are written into the A state, current values iBa, iCa of the current Icc are smaller than the current value iAa during verification of the B state and the C state respectively. For example, the current values iBa, iCa are smaller than the current value in accordance with the number of memory cells of verify pass (number of memory cells in an Off state) in the verification of the A state. The magnitude of the current Icc is substantially zero during verification of the B state and the C state.

The current Icc of the memory cell array in the final stage of writing data is indicated by a dotted line. As shown in the distribution (dotted line distribution) SAz in (a) of FIG. 23, most of the memory cells MC-A have a threshold equal to the verify voltage $V_{AV}$ or more in the final stage. Thus, the number of memory cells that are turned on during verification of the A state in the final stage decreases from the number of memory cells that are turned in the initial stage T1. As a result, a current value iAz of the current (dotted line waveform) Icc in the final stage T2 is smaller than the current value iAa of the current Icc in the initial stage.

All memory cells to be written into the A state are locked out during verification of the B state and the C state in the final stage. In the final stage of writing data, like in the initial stage of writing data, current values iBz, iCz of the current Icc during verification of the B state and the C state are smaller than the current value iAz and the current Icc is hardly generated during verification of the B state and the C state.

However, a current of a current value caused by memory cells of the A state may be generated in a certain period (for example, a period from time STB2A to time STB1B) during verification concerning the B state in accordance with the timing of the lockout processing LCKA on memory cells of the A state.

If all memory cells are written into the A state in, for example, a flash memory in which lockout processing is not performed or a flash memory in which lockout processing is performed based on a verification result, the current in the memory cell array has a current value in accordance with the number of memory cells turned on by the verify levels $V_{BV}$, $V_{CV}$ of the B state and the C state at least during verification of the B and the C state in the initial stage. Also, in a flash memory in which lockout processing is not performed or a flash memory in which lockout processing is performed based on a verification result, the current value of the current Icc during verification of the B and C states becomes larger than the value of the current Icc during verification of the A state in the final stage of the write loop.

Figure 24:
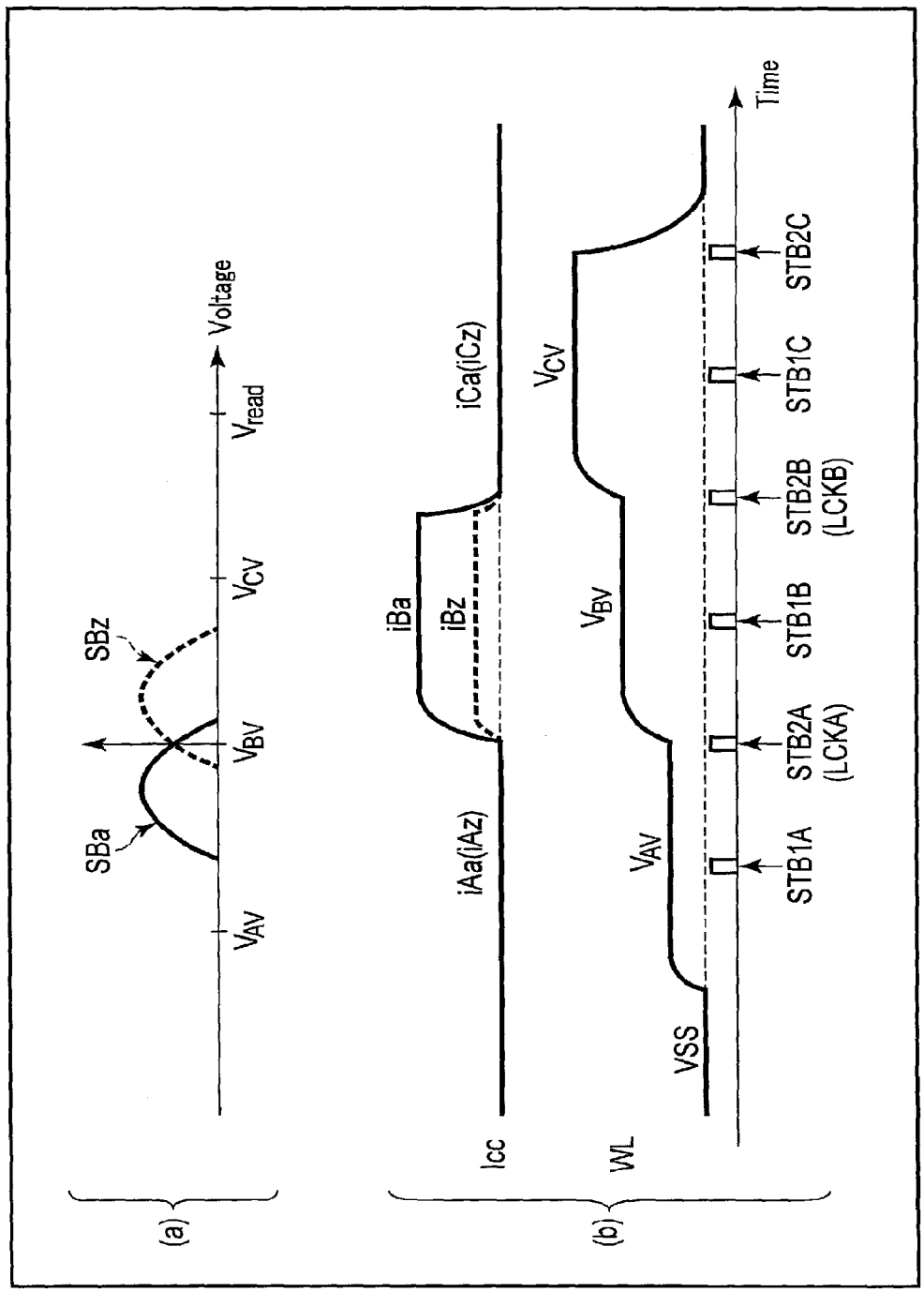
FIG. 24 is schematic diagrams illustrating a supplementary example of the semiconductor memory according to an embodiment.

FIG. 24 is a schematic diagram illustrating the verify operation of a flash memory according to the present embodiment when data corresponding to the B state is written into all memory cells of the selected page.

(a) of FIG. 24 shows distributions SBa, SBz of the threshold state of memory cells in the initial stage (first half of the write loop) and the final stage (second half of the write loop) of writing data.

(b) of FIG. 24 is a timing chart showing changes in the potential of the selected word line and changes in the current Icc in a memory cell array during the verify step.

As shown in (a) and (b) FIG. 24, regarding the current (solid line waveform) Icc in the initial stage of writing data, most of the memory cells MC-B to be written into the B state indicated by the distribution (solid line distribution) SBa are turned on by the verify level $V_{BV}$. The current Icc has the current value iBa in accordance with the number of memory cells that are turned on (memory cells of verify fail).

The lockout processing LCKB is performed on all the memory cells MC-B to be written into the B state based on write data during verification of the C state.

Thus, if all the memory cells are written into the B state, the current value iCa of the current Icc during verification of the C state is smaller than the current value iBa in accordance with the number of memory cells of verify pass (memory cells in an Off state) in the verification of the B state. For example, the magnitude of the current Icc is substantially zero during verification of the C state.

As shown in the distribution (dotted line distribution) SBz in (a) of FIG. 24, most of the memory cells MC-B have a threshold equal to the verify voltage $V_{BV}$ or more and thus, the number of memory cells that are turned on during verification of the B state in the final stage T2 decreases from the number of memory cells turned on in the initial stage T1. In the present embodiment, therefore, the current value iBz of the current (dotted line waveform) Icc in the final stage becomes smaller than the current value iBa of the current Icc in the initial stage.

All the memory cells MC-B to be written into the B state are locked out during verification of the C state. In the final stage of writing data, the current value iCz of the current Icc during verification of the C state is smaller than the current value iBz and the current Icc is not generated during verification of the C state.

However, a current of a current value caused by memory cells of the B state may be generated in a certain period (for example, a period from time STB2B to time STB1C) during verification concerning the C state in accordance with the timing of the lockout processing LCKB on memory cells of the B state.

In FIG. 24, memory cells to be written into the B state have a threshold higher than the verify level $V_{AV}$ ($V_{LM}$) during verification of the A state and thus, the memory cells are not turned on. Therefore, the current values iAa, iAz of the current Icc during verification of the A state are smaller than the current values iBa, iBz and are substantially zero. When all memory cells are written into the B state (or the C state), verification of states lower than the B state (or the C state) may be omitted.

If all memory cells are written into the B state in, for example, a flash memory in which lockout processing is not performed or a flash memory in which lockout processing is performed based on a verification result, the current Icc in the memory cell array has a current value in accordance with the number of memory cells turned on by the verify level $V_{CV}$ of the C state at least during verification of the C state in the initial stage. Also, in a flash memory in which lockout processing is not performed or in which lockout processing is performed based on a verification result, the current value of the current Icc during verification of the C state in the final stage becomes larger than the value of the current Icc during verification of the B state.

Even when the same data is written into all memory cells in the selected page, a flash memory according to the present embodiment can achieve the above effect.

(F) Other

In the present embodiment, reading of data in the ABL method (threshold determination) is shown. However, the verify operation of a flash memory according to the present embodiment can be applied to flash memories in which the threshold of a memory cell is determined by other sense methods (for example, the voltage detection method).

In the present embodiment, the twice reading method (2-strobe method) is used for reading/verification. However, lockout processing based on write data may be performed on a flash memory in which a threshold determination is made once for one state. In this case, after the threshold determination in the verification of a certain state, the potential of the bit line of memory cells to be written into the verified state is caused to transition from the voltage VDDSA to the voltage VSS and verified memory cells and bit lines are locked out.

In the present embodiment, the verify operation of a 4-valued memory cell has been described. However, the verify operation of a flash memory according to the present embodiment can also be applied to flash memories including a memory cell other than the 4-valued memory cell such as a 2-valued (1-bit) memory cell and an 8-valued (3-bit) memory cell.

In the present embodiment, a semiconductor memory (NAND-type flash memory) having a memory cell array in a two-dimensional structure is shown. However, a semiconductor memory according to the present embodiment may be a NAND-type flash memory having a memory cell array in a three-dimensional structure. In a memory cell array in a three-dimensional structure, a plurality of memory cells are arranged in an X direction and a Y direction parallel to a substrate surface and also stacked in a Z direction perpendicular to the substrate surface.

Memory cells stacked in the Z direction are provided on the side face of a semiconductor pillar on a semiconductor substrate. In a memory cell array in a three-dimensional structure, for example, each memory cell includes a conductive layer as a control gate and a memory film between the semiconductor pillar and the conductive layer. The memory film is a laminated film including a charge storage layer.

A semiconductor memory according to the present embodiment may also be a memory other than the NAND-type flash memory.

A semiconductor memory according to an embodiment includes the following aspect:

A semiconductor memory includes a memory cell array including memory cells, each of memory cells corresponding to any one state of first, second, third, and fourth threshold states corresponding to first, second, third, and fourth data respectively; bit lines connected to the plurality of respective memory cells; a word line commonly connected to the memory cells; and a control circuit that controls writing of data into the memory cell array, wherein the writing of the data includes one or more program steps and one or more verify steps and the control circuit passes a first current into the memory cell array during the verify step. In the verify step in a first portion from a start of the writing of the data, during first verification of the second threshold state higher than the first threshold state, the first current has a first current value in a first period from the start of the first verification to a first time. First processing that excludes first memory cells into which the first data is to be written among the memory cells as verification objects is performed at the first time. Second verification of the third threshold state higher than the second threshold state is started at the first time and the first current has a second current value larger than the first current value in a second period from the start of the second verification to a second time. Second processing that excludes second memory cells into which the second data is to be written from the verification objects is performed at the second time. Third verification of the fourth threshold state higher than the third threshold state is started at the second time and the first current has a third current value equal to the second current value or less in a third period from the start of the third verification to a third time.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor memory device comprising:
a memory cell array including memory cells, a memory cell capable of storing any one among first data, second data, and third data; and
a controller configured to control a first verify operation in writing of data to the memory cell array,
wherein the controller executes verification of the second data in a first verify period in the first verify operation and verification of the third data in a second verify period in the first verify operation, and wherein the controller excludes memory cells to be written the first data among the memory cells from a target of the first verify operation at a first time instant in the first verify period and excludes memory cells to be written the second data from the target at a second time instant in the second verify period.

2. The device according to claim 1, wherein
a first current flows through a source line of the memory cell array in the writing of data,
the first current has a first value in a first period from a start of the first verify period to the first time instant,
the first current has a second value smaller than the first value in a second period from the first time instant to a start of the second verify period,
the first current has a third value lager than the first value in a third period from the start of the second verify period to the second time instant, and
the first current has a fourth value smaller than the third value in a fourth period from the second time instant to an end of the second verify period.

3. The device according to claim 2, wherein
the second value has a magnitude of half the first value,
the third value has the magnitude 1.5 times the first value, and
the fourth value has the magnitude substantially equal to the first value.

4. The device according to claim 2, wherein
the memory cell is capable of storing fourth data,
the controller executes verification of the fourth data in a third verify period in the first verify operation,
the first current has a fifth value in a fifth period from the end of the second verify period to a third time instant in the third verify period, and
the first current has a sixth value smaller than the third current value in a sixth period from the third time instant to an end of the third verify period.

5. The device according to claim 4, wherein
the fifth value has the magnitude substantially equal to the fourth value, and
the sixth value has the magnitude substantially equal to the second value.

6. The device according to claim 4, wherein
the fifth value is larger than the fourth value, and
the sixth value is equal to the second value or less.

7. The device according to claim 2, wherein
the writing of the data includes the second verify operation after the first verify operation,
the first current has a seventh value in the first period in the second verify operation,
the first current has an eighth value smaller than the second and seventh values in the second period in the second verify operation,
the first current has a ninth value larger than the eighth value in the third period in the second verify operation, and
the first current has a tenth value smaller than the ninth value in the fourth period in the second verify operation.

8. The device according to claim 7, wherein
the memory cell is capable of storing fourth data,
the controller executes verification of the fourth data in a third verification period in the second verify operation,
the first current has a eleventh value larger than the tenth value in a fifth period from the end of the second verification period to a third time instant in the third verification period, and
the first current has a twelfth value smaller than the eleventh value in a sixth period from the third time instant to an end of the third verification period.

9. The device according to claim 8, wherein
the eleventh value has the magnitude substantially equal to the ninth value, and
the twelfth value has the magnitude substantially equal to the tenth value.

10. The device according to claim 2, wherein
memory cells into which the first data is to be written are connected to respective first bit lines,
memory cells into which the second data is to be written are connected to respective second bit lines,
a first voltage is applied to the first and second bit lines in the first period,
a second voltage lower than the first voltage is applied to the first bit lines in the second period, and
the first voltage is applied to the second bit lines in the second period.

11. The device according to claim 1, wherein
in the period from the start of the second verify period to the second time instant,
memory cells as a verify target include memory cells of verify pass in the verification of the second data, memory cells of verify fail in the verification of the second data and memory cells into which the third data is to be written.

* * * * *